(12) United States Patent
Mun et al.

(10) Patent No.: US 11,069,580 B2
(45) Date of Patent: Jul. 20, 2021

(54) METHOD OF MANUFACTURING A SEMICONDUCTOR DEVICE INCLUDING A PLURALITY OF CHANNEL PATTERNS

(71) Applicant: SAMSUNG ELECTRONICS CO., LTD., Suwon-si (KR)

(72) Inventors: Jeongho Mun, Yongin-si (KR); Naery Yu, Suwon-si (KR); Sumin Kim, Suwon-si (KR); Songse Yi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/793,097

(22) Filed: Feb. 18, 2020

(65) Prior Publication Data

US 2021/0013110 A1    Jan. 14, 2021

(30) Foreign Application Priority Data

Jul. 9, 2019    (KR) .......................... 10-2019-0082703

(51) Int. Cl.
| | |
|---|---|
| *H01L 21/8238* | (2006.01) |
| *H01L 27/092* | (2006.01) |
| *H01L 21/3213* | (2006.01) |

(52) U.S. Cl.
CPC ........... *H01L 21/823842* (2013.01); *H01L 21/823821* (2013.01); *H01L 27/0924* (2013.01); *H01L 21/32134* (2013.01); *H01L 21/32139* (2013.01)

(58) Field of Classification Search
CPC combination set(s) only.
See application file for complete search history.

(56) References Cited

U.S. PATENT DOCUMENTS

| | | |
|---|---|---|
| 7,744,768 B2 | 6/2010 | Kozawa et al. |
| 8,158,335 B2 | 4/2012 | Yeh et al. |
| 9,893,167 B2 | 2/2018 | Kim et al. |
| 9,972,542 B1 | 5/2018 | Bi et al. |
| 10,069,015 B2 | 9/2018 | Cheng et al. |
| 10,103,065 B1 | 10/2018 | Mochizuki et al. |
| 10,109,533 B1 | 10/2018 | Xie et al. |
| 2007/0106021 A1 | 5/2007 | Kozawa et al. |
| 2010/0068656 A1 | 3/2010 | Yeh et al. |
| 2017/0053998 A1 | 2/2017 | Kim et al. |
| 2018/0090624 A1 | 3/2018 | Cheng et al. |
| 2018/0308766 A1 | 10/2018 | Mochizuki et al. |
| 2018/0308768 A1 | 10/2018 | Mochizuki et al. |

*Primary Examiner* — Mounir S Amer
(74) *Attorney, Agent, or Firm* — Sughrue Mion, PLLC

(57) ABSTRACT

A semiconductor device manufacturing method includes forming a gate dielectric layer surrounding first semiconductor patterns and second semiconductor patterns; forming a first organic pattern covering the second semiconductor patterns; forming a sacrificial pattern interposed between the first semiconductor patterns and exposing both side surfaces of the first semiconductor patterns, and a conductive pattern surrounding the second semiconductor patterns and disposed between the first organic pattern and the second semiconductor patterns; forming a second organic pattern covering the first semiconductor patterns, the gate dielectric layer, the sacrificial pattern, and the first organic pattern; and forming a cross-linking layer interposed between the first organic material pattern and the second organic material pattern.

20 Claims, 14 Drawing Sheets

METHOD OF MANUFACTURING A SEMICONDUCTOR DEVICE INCLUDING A PLURALITY OF CHANNEL PATTERNS

CROSS-REFERENCE TO RELATED APPLICATION

This application claims from Korean Patent Application No. 10-2019-0082703, filed on Jul. 9, 2019, in the Korean Intellectual Property Office, the disclosure of which is incorporated herein by reference in its entirety.

BACKGROUND

1. Field

The present disclosure relates to a semiconductor device including a plurality of channel patterns and a method of manufacturing the same.

2. Description of Related Art

There is a growing demand for miniaturization of semiconductor devices in order to realize high capacity, high performance and highly integrated devices. In order to increase the degree of integration of semiconductor elements per unit area in accordance with the growing demand, studies are underway to reduce the size of the semiconductor elements and reduce the space between the semiconductor elements.

In order to achieve miniaturization of semiconductor devices, a gate-all-around (or multi-bridge channel type) transistor including a plurality of rectangular thin channels and a gate formed to surround these channels in up, down, left, and right directions is contemplated.

SUMMARY

Provided are gate-all-around (or multi-bridge channel type) semiconductor devices with different work function metal layers.

Also provided is a method of manufacturing gate-all around (or multi-bridge channel type) semiconductor devices having different work function metal layers.

According to an aspect of an example embodiment, there is provided a semiconductor device manufacturing method including: forming first semiconductor patterns extending in a first direction on a substrate, the first semiconductor patterns being spaced vertically from each other; forming second semiconductor patterns positioned adjacent to the first semiconductor patterns in a second direction perpendicular to the first direction on the substrate and extending in the first direction parallel to the first semiconductor patterns; forming a gate dielectric layer surrounding the first semiconductor patterns and the second semiconductor patterns; forming a first organic pattern covering the second semiconductor patterns; forming a sacrificial pattern interposed between the first semiconductor patterns and exposing both side surfaces of the first semiconductor patterns in the second direction, and a conductive pattern surrounding the second semiconductor patterns and disposed between the first organic pattern and the second semiconductor patterns; forming a second organic pattern covering the first semiconductor patterns, the gate dielectric layer, the sacrificial pattern, and the first organic pattern; forming a cross-linking layer interposed between the first organic pattern and the second organic pattern; removing the second organic pattern on the cross-linking layer and exposing the sacrificial pattern; and removing the sacrificial pattern.

According to an aspect of an example embodiment, there is provided a semiconductor device manufacturing method including: forming first semiconductor patterns extending in a first direction on a substrate, the first semiconductor patterns vertically overlapping each other; forming second semiconductor patterns extending in the first direction in parallel with the first semiconductor patterns and adjacent to the first semiconductor patterns in a second direction perpendicular to the first direction, and vertically overlapping each other; forming a gate dielectric layer surrounding the first semiconductor patterns and the second semiconductor patterns; forming a conductive layer surrounding the gate dielectric layer; forming a first organic pattern covering a portion of the conductive layer; forming a conductive pattern surrounding a sacrificial pattern and the second semiconductor patterns, the sacrificial pattern being interposed between the first semiconductor patterns, the conductive pattern being formed by removing a second portion of the conductive layer, and forming a recess region defined by the first organic pattern and the conductive pattern; forming an organic layer covering the first semiconductor patterns, the gate dielectric layer, and the first organic pattern, the organic layer filling the recess region; converting a portion of the organic layer into a cross-linking layer in contact with the first organic pattern, and forming a non-crosslinking portion on the cross-linking layer; removing the non-crosslinking portion and exposing the sacrificial pattern; and removing the sacrificial pattern, wherein the converting the portion of the organic layer into the cross-linking layer includes diffusing an acid of the first organic pattern into the organic layer.

According to an aspect of an example embodiment, there is provided a semiconductor device manufacturing method including: forming a first transistor including first semiconductor patterns surrounded by a work function metal layer on a substrate, and forming a second transistor including second semiconductor patterns parallel to the first semiconductor patterns on the substrate, and a conductive pattern surrounding the second semiconductor patterns under the work function metal layer, the conductive pattern extending in one direction; wherein the forming the first transistor includes forming sacrificial patterns disposed between the first semiconductor patterns vertically spaced apart from each other, wherein both side surfaces of each sacrificial pattern from among the plurality of sacrificial patterns are exposed, and wherein the forming the second transistor includes forming a first organic pattern covering the conductive pattern, a cross-linking layer covering the first organic pattern, and a second organic pattern covering the cross-linking layer.

BRIEF DESCRIPTION OF THE DRAWINGS

The above and other aspects will be more apparent from the following description of example embodiments taken in conjunction with the accompanying drawings, in which.

DETAILED DESCRIPTION

Figure 1:
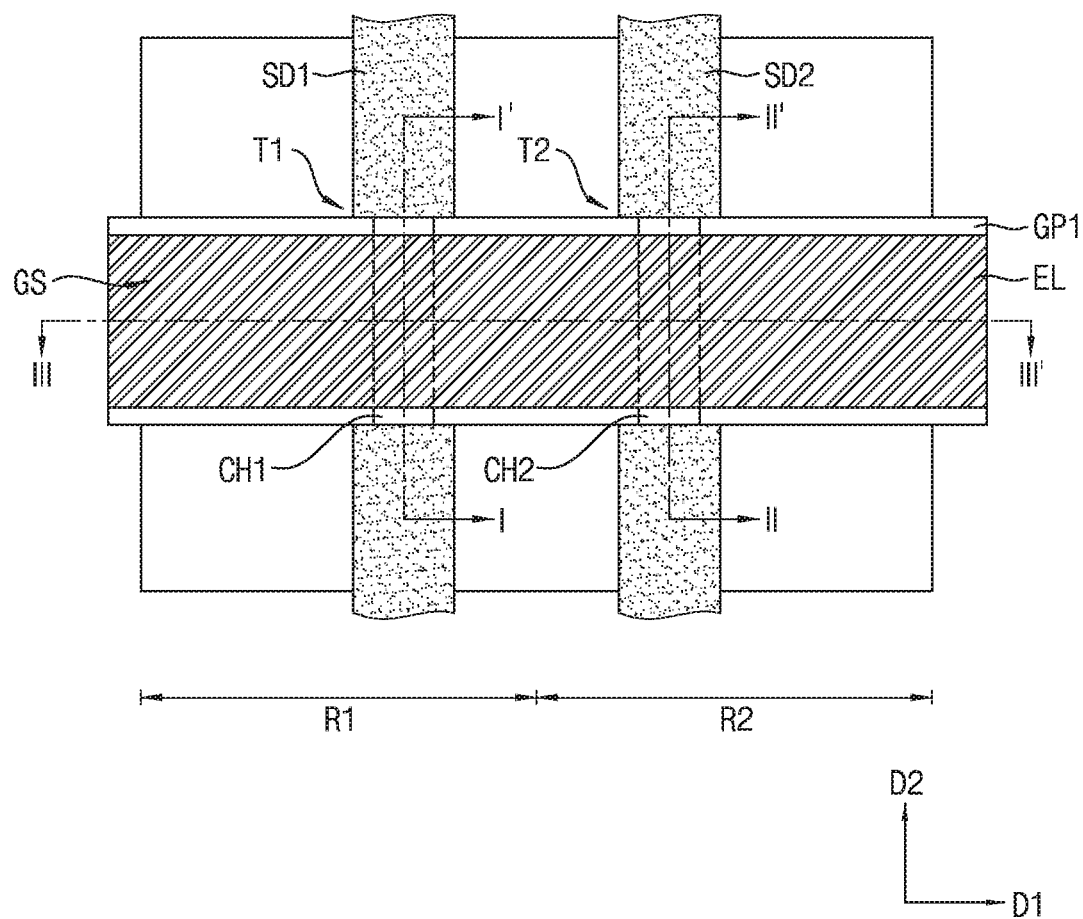
FIG. 1 is a plan view illustrating a semiconductor device according to an embodiment.
Figure 2:
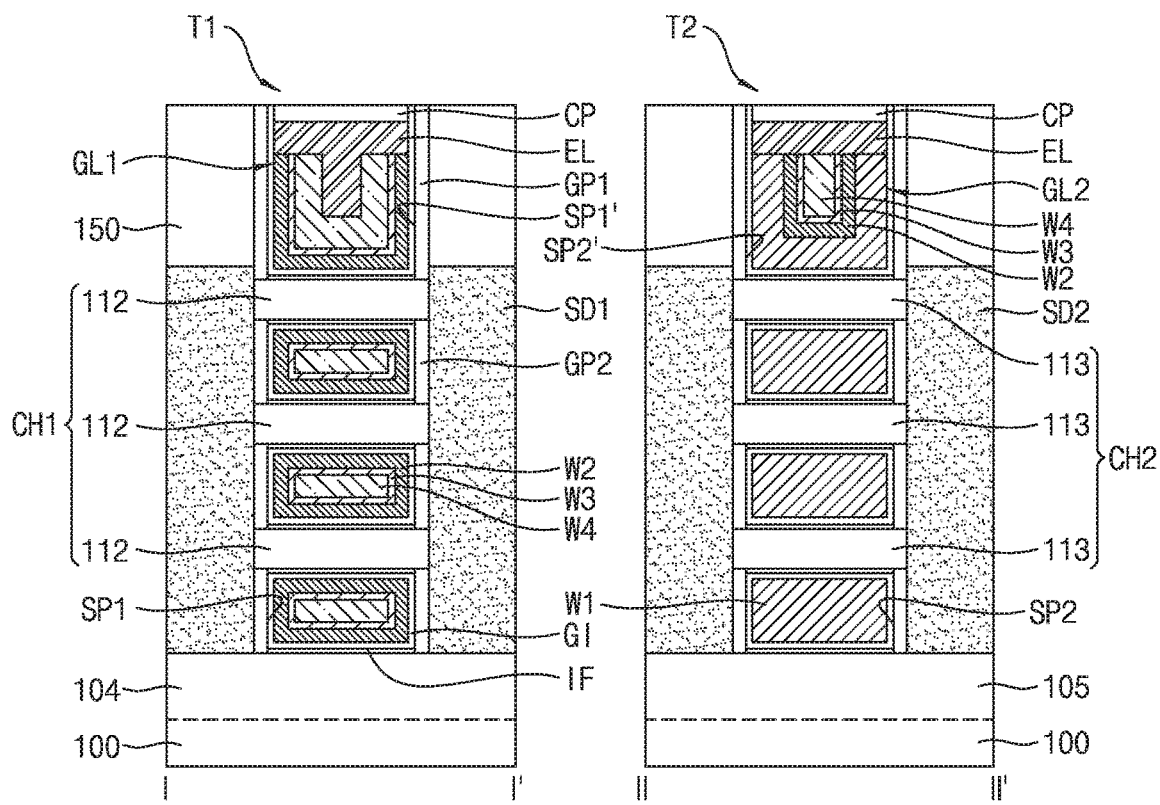
FIG. 2 is a cross-sectional view taken along lines I-I' and II-II' of FIG. 1.
Figure 3:
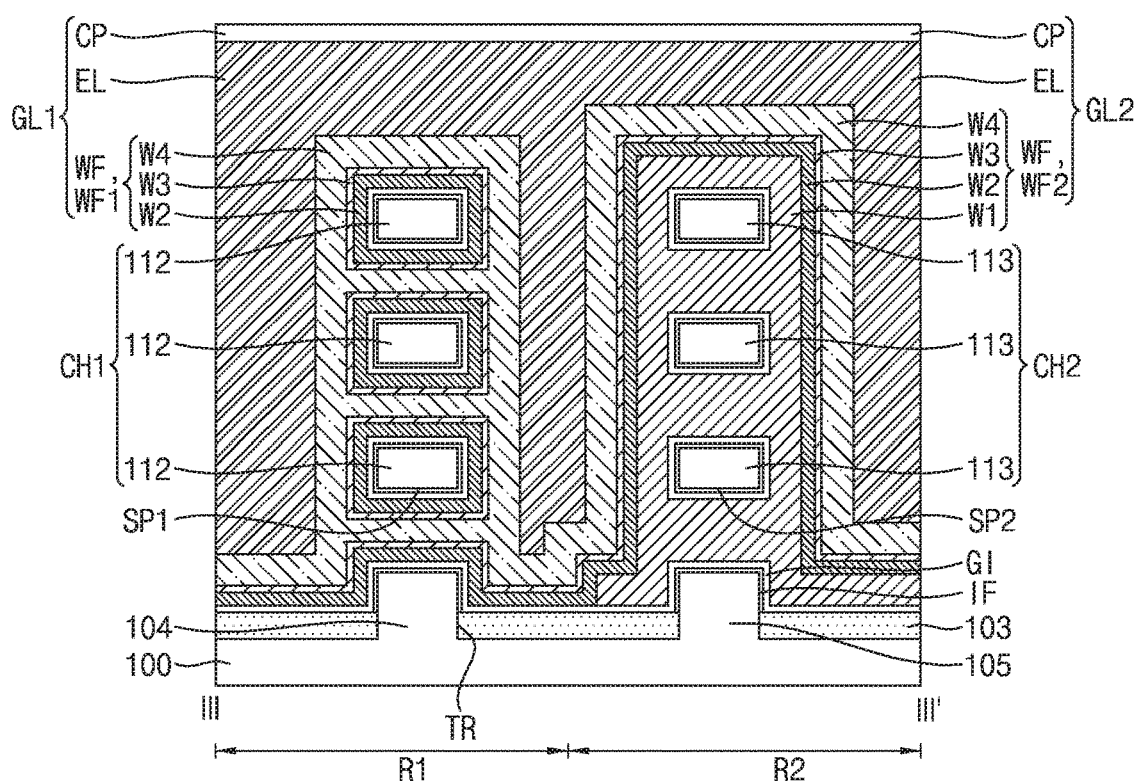
FIG. 3 is a cross-sectional view taken along line III-III' of FIG. 1.

FIG. 1 is a plan view illustrating a semiconductor device according to an example embodiment of the disclosure. FIG. 2 is a cross-sectional view taken along lines I-I' and II-II' of FIG. 1. FIG. 3 is a cross-sectional view taken along line III-III' of FIG. 1.

Referring to FIGS. 1, 2, and 3, a semiconductor device may include a first active region R1, a second active region R2, and a gate structure GS on a substrate 100.

The substrate 100 may include bulk silicon or silicon-on-insulator (SOI). In an example the substrate 100 may comprise a silicon substrate or other materials, such as germanium, silicon germanium, indium antimonide, lead tellurium compounds, indium arsenide, indium phosphide, gallium arsenide or antimony. It may include gallium, but is not limited thereto.

The first active region R1 and the second active region R2 may be disposed adjacent to each other. The first active region R1 and the second active region R2 may have a rectangular shape extending in the second direction D2, but embodiments are not limited thereto. The first active region R1 and the second active region R2 may be arranged side by side and adjacent to each other in a long side direction as shown in FIG. 1.

The first active region R1 may have a different conductivity type from that of the second active region R2. In an example embodiment, the first active region R1 may be a P-type doped region in which an N-type metal-oxide-semiconductor (NMOS) is formed, and the second active region R2 may be an N-type doped region in which a P-type metal-oxide-semiconductor (PMOS) is formed.

The first transistor T1 may be disposed in the first active region R1, and the second transistor T2 may be disposed in the second active region R2. The first transistor T1 may be an N-type metal-oxide-semiconductor field-effect transistor (NMOSFET), and the second transistor T2 may be a P-type metal-oxide-semiconductor field-effect transistor PMOSFET. For example, the first active region R1 is a region in which a pull-down transistor or a pass-gate transistor of a static random access memory (SRAM) is formed, and the second active region R2 is a region in which a pull-up transistor of the SRAM is formed, but the disclosure is not limited thereto. That is, when a gate voltage is applied to one gate structure GS to form NMOSFETs and PMOSFETs adjacent to each other, a region in which the NMOSFET is formed is the first active region R1 and a region in which the PMOSFET is formed is the second active region R2.

The first transistor T1 and the second transistor T2 may each be a multi-bridge channel FET (MBCFET) or a gate-all-around transistor having wire-shaped semiconductor patterns.

Referring to FIGS. 1, 2, and 3, a semiconductor device may include a substrate 100, an isolation layer 103 (see FIG. 3), a first channel pattern CH1, a second channel pattern CH2, a first upper pattern (i.e., a first substrate protrusion) 104, a second upper pattern (i.e., a second substrate protrusion) 105, source/drain regions SD1 and SD2, and the gate structure GS. The gate structure GS may include a first gate line GL1, a second gate line GL2, and gate spacers GP1 and GP2. The first transistor T1 includes the first channel pattern CH1, the first upper pattern 104, the first source/drain regions SD1, and the first gate line GL1, and the second transistor T2 may include the second channel pattern CH2, the second upper pattern 105, the second source/drain regions SD2, and the second gate line GL2.

The isolation layer 103 may be disposed on the substrate 100. The isolation layer 103 may define the first upper pattern 104 and the second upper pattern 105 that protrude upward from the substrate 100. For example, the isolation layer 103 may include an oxide.

The first upper pattern 104 may be disposed on the first active region R1, and the second upper pattern 105 may be disposed on the second active region R2. The first upper pattern 104 and the second upper pattern 105 may have a fin shape protruding from an upper surface of the substrate 100. The isolation layer 103 may fill the trench TR between the first upper pattern 104 and the second upper pattern 105 and may cover the upper surface of the substrate 100 in regions external to the trench TR as shown in FIG. 3. An upper surface of the isolation layer 103 may be lower than upper surfaces of the first upper pattern 104 and the second upper pattern 105.

The first channel pattern CH1 and the first source/drain regions SD1 may be disposed on the first upper patterns 104. The second channel pattern CH2 and the second source/drain regions SD2 may be disposed on the second upper pattern 105. The first channel pattern CH1 may vertically overlap the first upper pattern 104, and the second channel pattern CH2 may vertically overlap the second upper pattern 105. In other words, the first channel pattern CH1 may overlap the first upper pattern 104 when viewed in plan view and the second channel pattern CH2 may overlap the second upper pattern 105 when viewed in plan view. The first channel pattern CH1 may include the same material as that of the first upper pattern 104. The second channel pattern CH2 may include the same material as that of the second upper pattern 105. The first channel pattern CH1 may be interposed between a pair of first source/drain regions SD1 in the second direction D2. The second channel pattern CH2 may be interposed between a pair of second source/drain regions SD2 in the second direction D2.

The first channel pattern CH1 may include a plurality of first semiconductor patterns 112 that are vertically spaced apart from each other. The first semiconductor patterns 112 may have a wire or bar shape extending in one direction. In FIG. 3, the first semiconductor patterns 112 are illustrated as having an outer circumferential surface of an angled rectangle, but the disclosure is not limited thereto. The outer circumferential surfaces of the first semiconductor patterns 112 may have rounded corners. The first semiconductor patterns 112 may extend in the second direction D2 on the substrate 100. The first semiconductor patterns 112 may vertically overlap each other. The two ends of the first semiconductor patterns 112 may be connected to respective sidewalls of the pair of first source/drain regions SD1. In the FIGS. 2 and 3, three of the first semiconductor patterns 112 are shown, but the disclosure is not limited thereto.

The second channel pattern CH2 may include a plurality of second semiconductor patterns 113 vertically spaced apart from each other. The second semiconductor patterns 113 may have a wire or bar shape extending in the second direction D2. The second semiconductor patterns 113 may have the same or similar shape as the first semiconductor patterns 112. The second semiconductor patterns 113 may vertically overlap each other. The two ends of the second semiconductor patterns 113 may be connected to respective sidewalls of the pair of second source/drain regions SD2. In the FIGS. 2 and 3, three of the second semiconductor patterns 113 are shown, but the disclosure is not limited thereto. The second semiconductor patterns 113 may be disposed to be adjacent to and parallel with the first semiconductor patterns 112. In other words, the second semiconductor patterns 113 may extend parallel to the first semiconductor patterns 112 in the second direction D2 and may be adjacent to the first semiconductor patterns 112 in the first direction D1.

The first and second semiconductor patterns 112 and 113 positioned at the same level above the substrate 100 may be formed from the same semiconductor layer. The first and second semiconductor patterns 112 and 113 positioned at the same level above the substrate 100 may have substantially the same thicknesses as each other. The first and second semiconductor patterns 112 and 113 positioned at the same level above the substrate 100 may include substantially the same semiconductor material as each other. For example, the first and second semiconductor patterns 112 and 113 may include at least one of Si, SiGe, and Ge.

The first semiconductor patterns 112 of the first channel pattern CH1 may have the same thickness as each other or may have different thicknesses from each other. The second semiconductor patterns 113 of the second channel pattern CH2 may have the same thickness as each other or may have different thicknesses from each other.

The first source/drain regions SD1 may be epitaxial growth layers formed by using the first semiconductor patterns 112 and the first upper pattern 104 as seed layers. The second source/drain regions SD2 may be epitaxial growth layers formed by using the second semiconductor patterns 113 and the second upper pattern 105 as seed layers.

When the first transistor T1 is an NMOSFET, the first source/drain regions SD1 may include a material that provides a tensile strain to the first channel pattern CH1. For example, the first source/drain regions SD1 may include a semiconductor element (e.g., SiC) having a lattice constant smaller than that of the semiconductor element of the substrate 100. The first source/drain regions SD1 may be doped with impurities to have an N-type conductivity.

When the second transistor T2 is a PMOSFET, the second source/drain regions SD2 may include a material that provides a compressive strain to the second channel pattern CH2. For example, the second source/drain regions SD2 may include a semiconductor element (e.g., SiGe) having a lattice constant greater than that of the semiconductor element of the substrate 100. The second source/drain regions SD2 may be doped with impurities to have a P-type conductivity.

The gate structure GS may cross the first and second channel patterns CH1 and CH2 and extend in the first direction D1 as shown in FIG. 1. The gate structure GS may include gate lines GL1 and GL2, an interfacial layer IF, a gate dielectric layer GI, and gate spacers GP1 and GP2.

The gate structure GS may be formed by integrally connecting the first gate line GL1 disposed in the first active region R1 and the second gate line GL2 disposed in the second active region R2. The first gate line GL1 may cover the first upper pattern 104 and the first semiconductor patterns 112 of the first channel pattern CH1. For example, the first gate line GL1 may be positioned above the first upper pattern 104 and the first semiconductor patterns 112. The second gate line GL2 may cover the second upper pattern 105 and the second semiconductor patterns 113 of the second channel pattern CH2. For example, the second gate line GL2 may be positioned above the second upper pattern 105 and the second semiconductor patterns 113.

The first gate line GL1 may include a first work function adjustment metal layer WF1, a gate electrode layer EL, and a gate capping layer CP. The second gate line GL2 may include a second work function adjustment metal layer WF2 having a different number of layers from the first work function adjustment metal layer WF1, a gate electrode layer EL, and a gate capping layer CP.

The first work function adjustment metal layer WF1 may cover the first semiconductor patterns 112 and the first upper pattern 104 in the first active region R1. The second work function adjustment metal layer WF2 may cover the second semiconductor patterns 113 and the second upper pattern 105 in the second active region R2. The first and second work function adjustment metal layers WF1 and WF2, collectively referred to as WF, may each include a plurality of work function metal layers. For example, although the first to fourth work function metal layers W1, W2, W3, and W4 are illustrated in the figures, the number of work function metal layers is not limited thereto. For example, the first to fourth work function metal layers W1, W2, W3, and W4 may include at least one of TiN, TiC, TaN, TiAlC, TiSiN, and TaC, but are not limited thereto. The first to fourth work function metal layers W1, W2, W3, and W4 may include conductive materials having different work functions.

The gate electrode layer EL may be disposed on the work function adjustment metal layer WF. The gate electrode layer EL may extend in the first direction D1 and a third direction D3 perpendicular to both of the first direction D1 and the second direction D2. A resistance of the gate electrode layer EL may be lower than that of the work function adjustment metal layer WF. For example, the gate electrode layer EL may include at least one of low-resistance metals such as aluminum (Al), tungsten (W), titanium (Ti), and tantalum (Ta).

The gate capping layer CP may be disposed on the gate electrode layer EL. The gate capping layer CP may extend in the first direction D1. For example, the gate capping layer CP may include at least one of SiON, SiCN, SiCON, and SiN.

In an example embodiment, the first work function adjustment metal layer WF1 of the first gate line GL1 may include the second to fourth work function metal layers W2, W3, and W4. The second work function adjustment metal layer WF2 of the second gate line GL2 may include the first to fourth work function metal layers W1, W2, W3, and W4.

The second to fourth work function metal layers W2, W3, and W4 of the first work function adjustment metal layer WF1 may fill the first spaces SP1 between the first semiconductor patterns 112. The first work function metal layer W1 of the second work function adjustment metal layer WF2 may fill the second spaces SP2 between the second semiconductor patterns 112. The first spaces SP1 may be located between the first semiconductor patterns 112 on the first active region R1. The second spaces SP2 may be located between the second semiconductor patterns 113 on the second active region R2. In the first spaces SP1 and the second spaces SP2, the sizes of the first spaces SP1 and the second spaces SP2 positioned at the same level may be the same. For example, the vertical heights of the first spaces SP1 and the second spaces SP2 positioned at the same level may be the same. However, the disclosure is not limited thereto.

For example, as shown in FIG. 2, a first space SP1 may be defined on a lower side by the upper surface of the first upper pattern 104, on an upper side by a lower surface of a first semiconductor pattern 112, and on lateral sides by gate spacers GP2. Subsequent first spaces SP1 may be defined between adjacent first semiconductor patterns 112 and between corresponding gate spacers GP2.

For example, as shown in FIG. 2, a second space SP2 may be defined on a lower side by second upper pattern 105, on an upper side by a lower surface of a second semiconductor pattern 113, and on lateral sides by gate spacers GP2. Subsequent second spaces SP2 may be defined between adjacent second semiconductor patterns 113 and between corresponding gate spacers GP2.

The second to fourth work function metal layers W2, W3, and W4 of the first gate line GL1 are disposed in the first upper space SP1' on the first semiconductor pattern 112 that is positioned at the highest level in the third direction D3. The second to fourth work function metal layers W2, W3 and W4 may be sequentially stacked in the first upper space SP1' and may extend in the third direction D3 to have a U-shaped cross section. The second to fourth work function metal layers W2, W3, and W4 may not completely fill the first upper space SPY. The gate electrode layer EL and the gate capping layer CP are disposed on the second to fourth work function metal layers W2, W3, and W4 in the first upper space SPY to fill completely the first upper space SPY. The second to fourth work function metal layers W2, W3, and W4 of the first gate line GL1 may surround the first semiconductor patterns 112. The second to fourth work function metal layers W2, W3, and W4 may surround the upper surface, the bottom surface, and both sidewalls of the first semiconductor patterns 112 as shown in FIG. 3.

The first to fourth work function metal layers W1, W2, W3, and W4 of the second gate line GL2 are disposed in the second upper space SP2' on the second semiconductor pattern 113 that is positioned at the highest level in the third direction D3. The second upper space SP2' may be positioned at the same level as that of the first upper space SP1', and the first upper space SP1 'and the second upper space SP2' may have the same size.

The first to fourth work function metal layers W1, W2, W3, and W4 may be sequentially stacked in the second upper space SP2'. In an example embodiment, the first to third work function metal layers W1, W2, and W3 extend in the third direction D3 to have a U-shaped cross section, and a recess region defined by the third work function metal layer W3 can be formed. The fourth work function metal layer W4 may completely fill the recess region formed by the third work function metal layer W3 as shown in FIG. 2. The first to fourth work function metal layers W1, W2, W3, and W4 may not completely fill the second upper space SP2". The gate electrode layer EL and the gate capping layer CP are disposed on the first to fourth work function metal layers W1, W2, W3, and W4 in the second upper space SP2" to fill the second upper space SP2' completely.

The first to fourth work function metal layers W1, W2, W3, and W4 of the second gate line GL2 may surround the second semiconductor patterns 113. The first to fourth work function metal layers W1, W2, W3, and W4 may surround the upper surface and both sidewalls of the second semiconductor patterns 113. As shown in FIG. 3, the first work function metal layer W1 may surround the upper surface, the bottom surface, and both sidewalls of each of the individual second semiconductor patterns 113. The second to fourth work function metal layers W2, W3, and W4 may surround the upper surface and the sidewalls of the second semiconductor patterns 113 as a group.

The first work function metal layer W1 may extend in the first direction D1 in the second active region R2 and surround the upper surface, the bottom surface, and both sidewalls of the second semiconductor patterns 113. The first work function metal layer W1 may not be disposed in the first active region R1. In the first active region R1, the second to fourth work function metal layers W2, W3, and W4 may surround the first semiconductor patterns 112 and cover the first upper pattern 104. In the second active region R2, the second to fourth work function metal layers W2, W3, and W4 may extend in the first direction D1 to cover the first work function metal layer W1. The second to fourth work function metal layers W2, W3, and W4 may surround the first semiconductor patterns 112 in the first active region R1 and be sequentially stacked on the first work function metal layer W1 in the second active region R2. The second work function metal layer W2 may be disposed in direct contact with the first work function metal layer W1 in the second active region R2.

The interface layer IF may directly surround the first semiconductor patterns 112 of the first channel pattern CH1 and the second semiconductor patterns 113 of the second channel pattern CH2. The interface layer IF may directly cover the respective upper and side surfaces of the first upper pattern 104 and the second upper pattern 105 to contact the isolation layer 103. For example, the interface layer IF may include silicon oxide.

The gate dielectric layer GI may be interposed between the first semiconductor patterns 112 of the first channel pattern CH1 and the first gate line GL1. The gate dielectric layer GI may be interposed between the second semiconductor patterns 113 of the second channel pattern CH2 and the second gate line GL2. The gate dielectric layer GI may be disposed on the interface layer IF. The gate dielectric layer GI may directly cover the isolation layer 103. In other words, the gate dielectric layer GI may be disposed directly between the interface layer IF and the corresponding first and second semiconductor patterns 112 and 113. The gate dielectric layer may also directly contact and extend along an upper surface of the isolation layer 103. For example, the gate dielectric layer GI may include a high dielectric constant material having a higher dielectric constant than that of silicon oxide. The gate dielectric layer GI may be formed of a hafnium-based or zirconium-based material. For example, the gate dielectric layer GI may include at least one of hafnium oxide ($HfO_2$), hafnium silicon oxide (HfSiO), hafnium silicon oxynitride (HfSiON), hafnium oxynitride (HfON), hafnium aluminum oxide (HfAlO), hafnium lanthanum oxide (HfLaO), zirconium oxide ($ZrO_2$) and zirconium silicon oxide (ZrSiO). In addition, the gate dielectric layer GI is not limited to hafnium-based or zirconium-based materials and may include, for example, lanthanum oxide ($La2O_3$), lanthanum aluminum oxide ($LaAlO_3$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), lead scandium tantalum oxide (PbSc0.5Ta0.5$O_3$), and lead zinc niobate (PbZnNb$O_3$).

The gate spacers GP1 and GP2 may be disposed on both sidewalls of the gate lines GL1 and GL2. In other words, the gate spacers GP1 and GP2 may be disposed at both ends of the gate lines GL1 and GL2 in the second direction D2. The gate spacers GP1 and GP2 may extend in the first direction D1 along the first and second gate lines GL1 and GL2. The gate lines GL1 and GL2 may include inner spacers GP2 positioned at the same level as the first and second spaces SP1 and SP2 not including uppermost spaces SP1' and SP2'. Outer spacers GP1 may be positioned at the same level as the uppermost spaces SP1' and SP2'. The uppermost ends of the outer spacers GP1 may be higher than the upper surface of the gate electrode layer EL. The uppermost ends of the outer spacers GP1 may be coplanar with an upper surface of the gate capping layer CP. For example, the gate spacers GP1 and GP2 may include at least one of SiCN, SiCN, and SiN. In an example embodiment, the gate spacers GP1 and GP2 may include multiple layers.

FIGS. 4 to 26 are cross-sectional views illustrating a method of manufacturing a semiconductor device in accordance with an example embodiment of the disclosure. Like reference numerals in FIGS. 1 to 26 may refer to like elements. Hereinafter, for simplicity of the description, the same content as in FIGS. 1 to 3 will be omitted.

Figure 4:
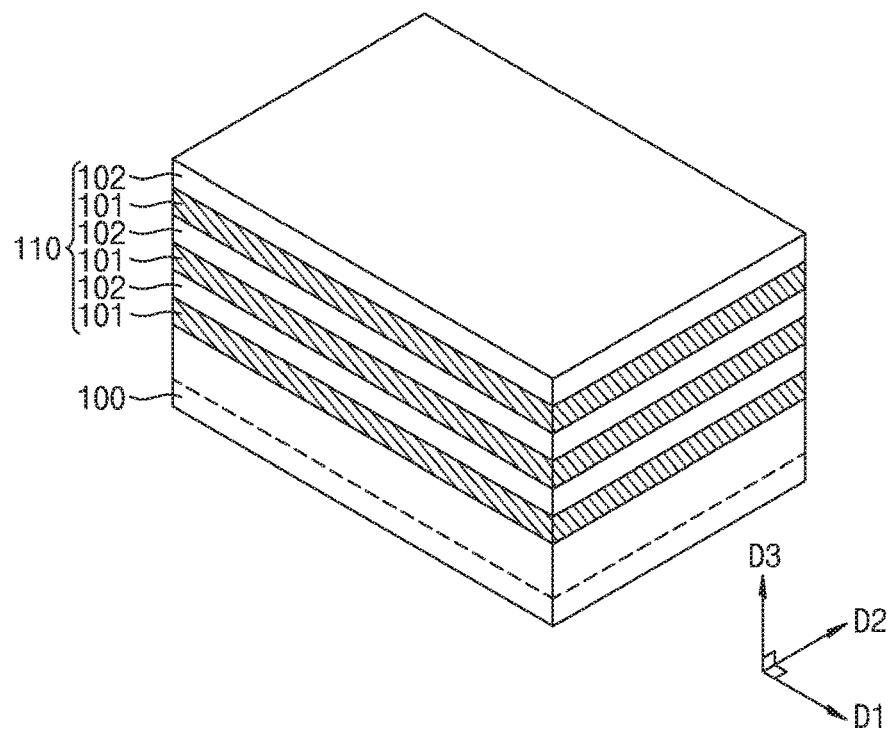
FIGS. 4 to 26 are cross-sectional views illustrating a method of manufacturing a semiconductor device according to an embodiment.
Figure 5:
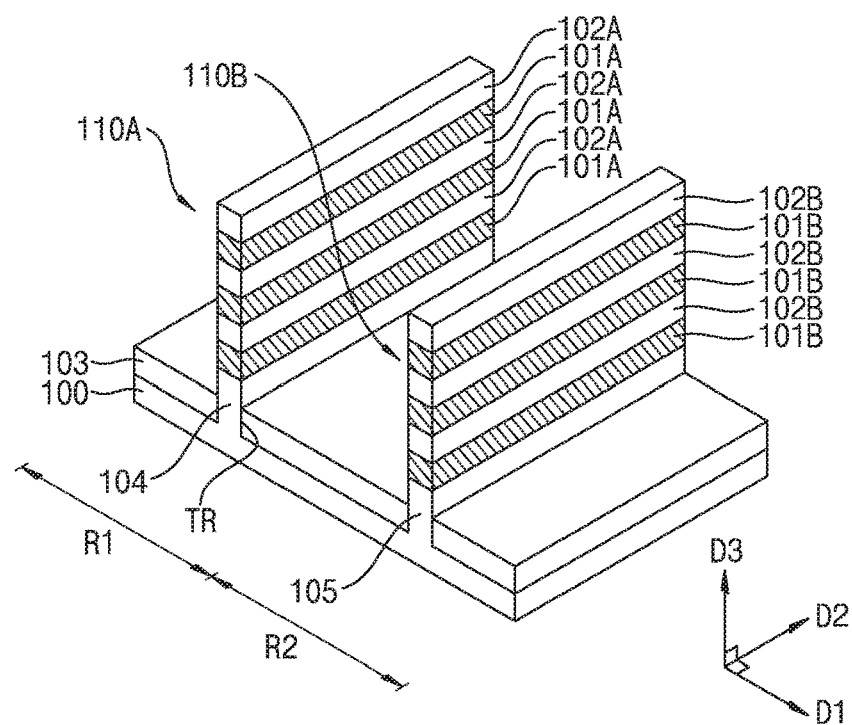

Referring to FIGS. 4 and 5, a method of manufacturing a semiconductor device according to an example embodiment of the disclosure may include forming a stack structure 110 in which sacrificial layers 101 and semiconductor layers 102 are alternately repeatedly stacked on the substrate 100. Although the sacrificial layers 101 and the semiconductor layers 102 are illustrated as being repeatedly stacked three times, the disclosure is not limited thereto. The sacrificial layers 101 may include a material having an etch selectivity with respect to the semiconductor layers 102. The semiconductor layers 102 may include a material that is not substantially etched during the process of etching the sacrificial layers 101. For example, the sacrificial layers 101 may include SiGe or Ge, and the semiconductor layers 102 may include Si.

The sacrificial layers 101 and the semiconductor layers 102 may be formed by an epitaxial growth process using the substrate 100 as a seed layer. The sacrificial layers 101 and the semiconductor layers 102 may be formed continuously in the same chamber. The sacrificial layers 101 and the semiconductor layers 102 may be grown conformally on the entire surface of the substrate 100.

The sacrificial layers 101, the semiconductor layers 102, and the substrate 100 may be patterned to form a first preliminary active pattern 110A and a second preliminary active pattern 110B as shown in FIG. 5. The upper portion of the substrate 100 may be partially removed by the patterning process to form first and second upper patterns 104 and 105. The first and second preliminary active patterns 110A and 110B may be disposed on the first and second upper patterns 104 and 105, respectively. The first and second preliminary active patterns 110A and 110B may be formed in a wire or bar shape extending in the second direction D2. The first preliminary active pattern 110A may include first preliminary sacrificial patterns 101A and first preliminary semiconductor patterns 102A that are alternately and repeatedly stacked. The second preliminary active pattern 110B may include second preliminary sacrificial patterns 101B and second preliminary semiconductor patterns 102B that are alternately and repeatedly stacked.

The upper portion of the substrate 100 may be etched by the patterning process to form trenches TR on both sides of each of the first and second upper patterns 104 and 105. The isolation layer 103 may be formed in the trench TR and may cover the upper surface of the substrate 100 in regions external to the trench TR as shown in FIG. 5. Forming the isolation layer 103 may include forming an insulating layer on the substrate 100 and recessing the insulating layer so that the first and second upper patterns 104 and 105 are completely exposed. The upper surface of the isolation layer 103 may be at a level lower than the upper surface of the first and second upper patterns 104 and 105. The first and second upper patterns 104 and 105 may protrude from the upper surface of the isolation layer 103.

Figure 6:
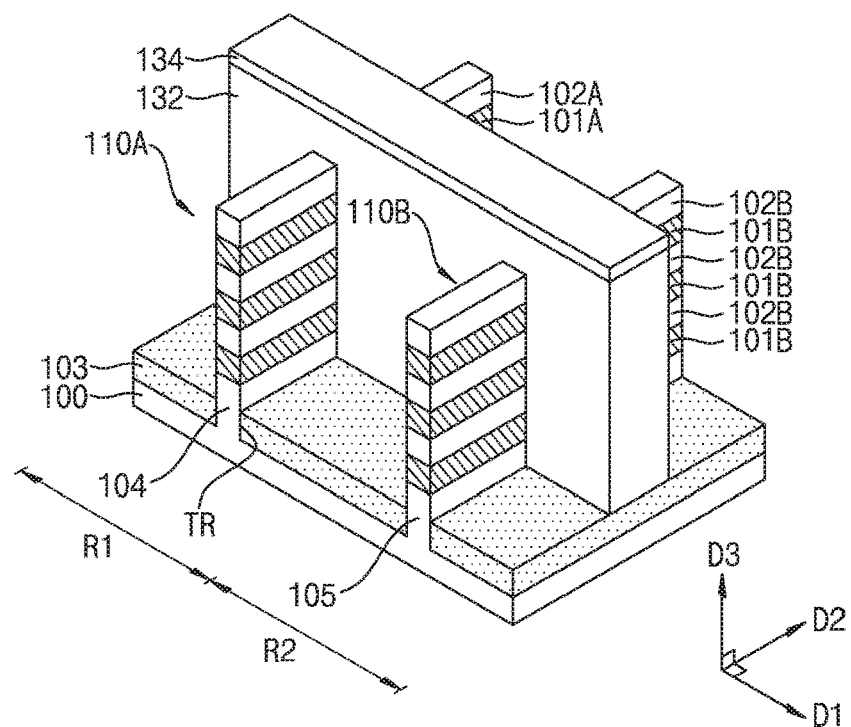

Referring to FIG. 6, the method may include forming a sacrificial gate pattern 132 across the first and second preliminary active patterns 110A and 110B. The sacrificial gate pattern 132 may be formed in a line or bar shape extending in the first direction D1. At least one gate mask pattern 134 may be provided on the sacrificial gate pattern 132. Forming the sacrificial gate pattern 132 and the gate mask pattern 134 may include sequentially forming the sacrificial gate layer and the gate mask layer on the substrate 100, and patterning the gate mask layer and the sacrificial gate layer sequentially. For example, the sacrificial gate layer may include polysilicon. The gate mask layer may include a silicon nitride or a silicon oxynitride.

Figure 7:
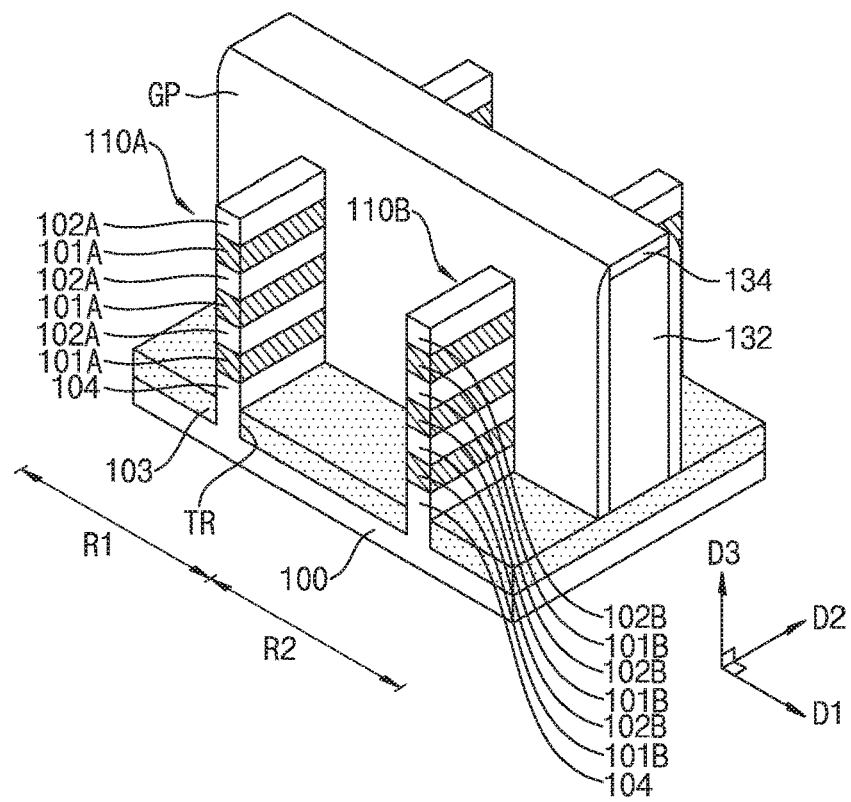

Referring to FIG. 7, the method may include forming a pair of gate spacers GP on each sidewall of the sacrificial gate pattern 132. The pair of gate spacers GP may be formed on sidewalls of the sacrificial gate pattern 132 that are perpendicular to the second direction D2 as shown in FIG. 7. The gate spacers GP may include at least one of SiCN, SiCON, and SiN. Forming the gate spacers GP may include forming a spacer layer by a deposition process such as chemical vapor deposition (CVD) or atomic layer deposition (ALD) and performing an anisotropic etching process on the spacer layer. The gate spacers GP may be referred to as outer spacers GP1.

Figure 8:
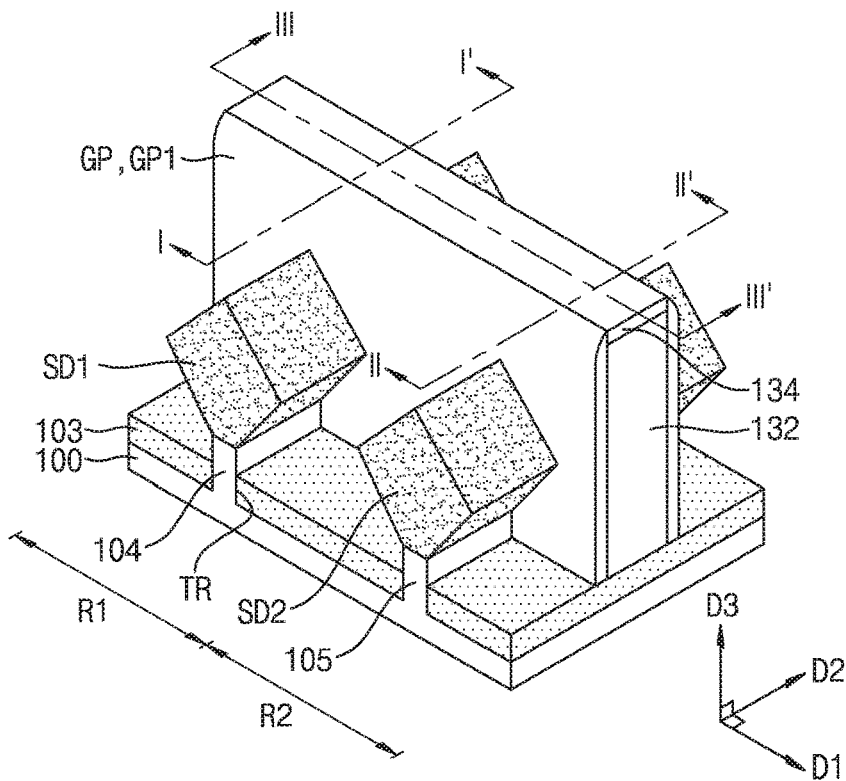
Figure 9:
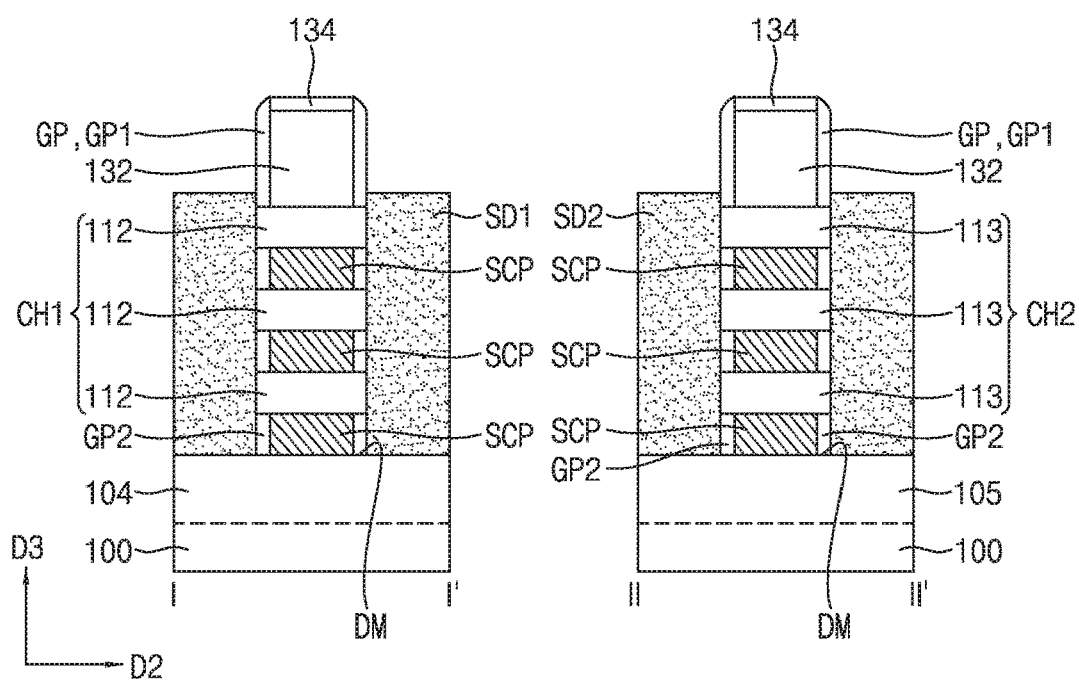
Figure 10:
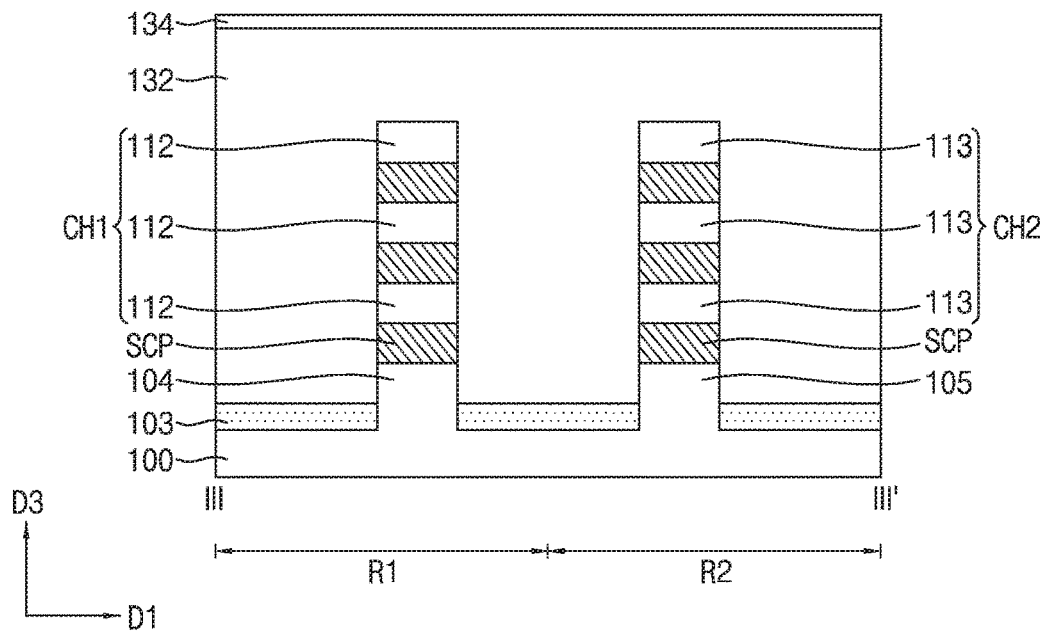

Referring to FIGS. 8 to 10, the method may include forming the first and second channel patterns CH1 and CH2 by patterning the first and second preliminary active patterns 110A and 110B. The first and second preliminary active patterns 110A and 110B may be patterned using the gate mask pattern 134 and the gate spacers GP as an etch mask. The first and second preliminary semiconductor patterns 102A and 102B of the first and second preliminary active patterns 110A and 110B may be patterned to form the first and second semiconductor patterns 112 and 113, respectively, as shown in FIGS. 9 and 10. The first semiconductor patterns 112 may constitute a first channel pattern CH1, and the second semiconductor patterns 113 may constitute a second channel pattern CH2. The first preliminary sacrificial patterns 101A and the second preliminary sacrificial patterns 101B of the first and second preliminary active patterns 110A and 110B may be patterned to form sacrificial patterns SCP as shown in FIGS. 9 and 10.

Portions of the first and second preliminary active patterns 110A and 110B that are not patterned to form the first and second semiconductor patterns 112 and 113 or the sacrificial patterns SCP may be etched to expose upper surfaces of the first and second upper patterns 104 and 105.

A portion of the sacrificial patterns SCP to be exposed after the patterning process may be horizontally removed to form recessed area DM as shown in FIG. 9. The recessed area DM may be formed by etching the sacrificial patterns SCP using an etching source having an etching selectivity. For example, when the first and second semiconductor patterns 112 and 113 include Si and the sacrificial patterns SCP include SiGe, forming the recessed area DM may include performing an etching process with an etchant containing peracetic acid. The recessed area DM may be formed on both ends of each of the sacrificial patterns SCP in the second direction D2.

Inner spacers GP2 may be formed to fill the recessed area DM. The inner spacers GP2 may be vertically spaced apart from each other with the first and second semiconductor patterns 112 and 113 interposed therebetween. To form the inner spaces GP2, the insulating layer may be conformally formed on the substrate 100, and the insulating layer may be etched so as to remain locally only in the recessed area DM to form the inner spacers GP2. The inner spacers GP2 may include the same material as that of the outer spacers GP1. For example, the inner spacers GP2 may include SiN.

As shown in FIG. 8, first source/drain regions SD1 may be formed at both sides of the first channel pattern CH1 in the second direction D2. Second source/drain regions SD2 may be formed at both sides of the second channel pattern CH2 in the second direction D2. First source/drain regions SD1 may be formed by performing a selective epitaxial process on the first semiconductor patterns 112 and the first upper pattern 104 as a seed layer. The first channel pattern CH1 and the first source/drain regions SD1 may be connected to each other to form an active pattern extending in the second direction D2. At the same time as the selective epitaxial process or after the selective epitaxial process, N-type impurities may be doped in the first source/drain regions SD1.

The second source/drain regions SD2 may be formed by performing a selective epitaxial process using the second semiconductor patterns 113 and the second upper pattern 105 as a seed layer. The second channel pattern CH2 and the second source/drain regions SD2 may be connected to each other to form an active pattern extending in the second direction D2. At the same time as the selective epitaxial process or after the selective epitaxial process, P-type impurities may be doped into the second source/drain regions SD2.

Figure 11:
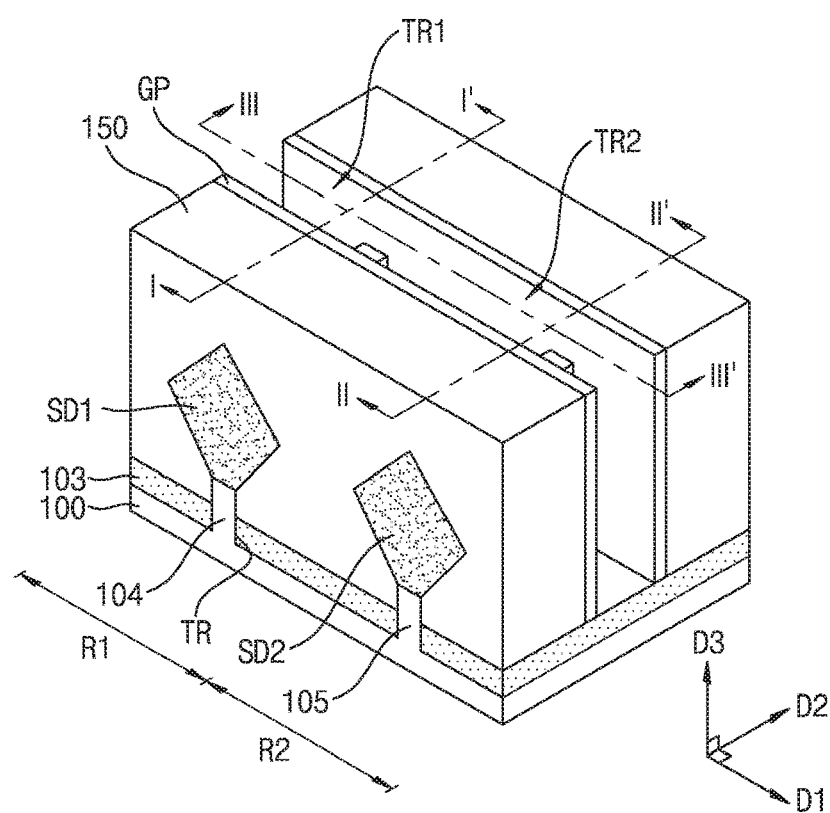
Figure 12:
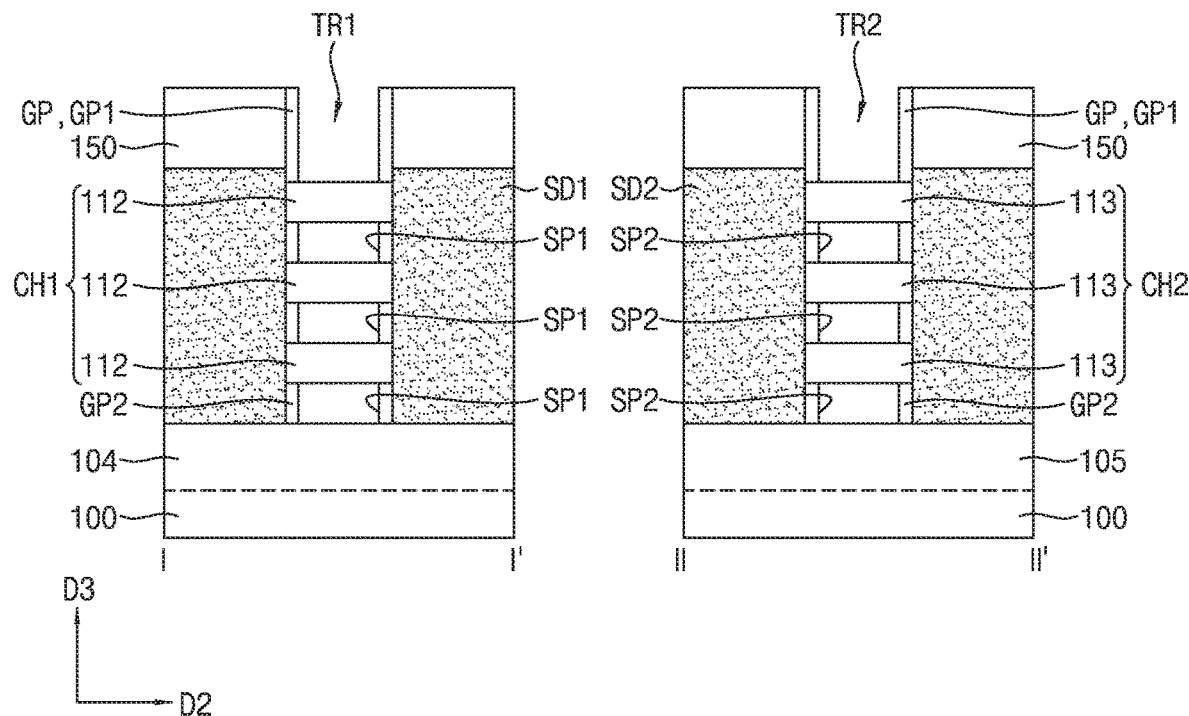
Figure 13:
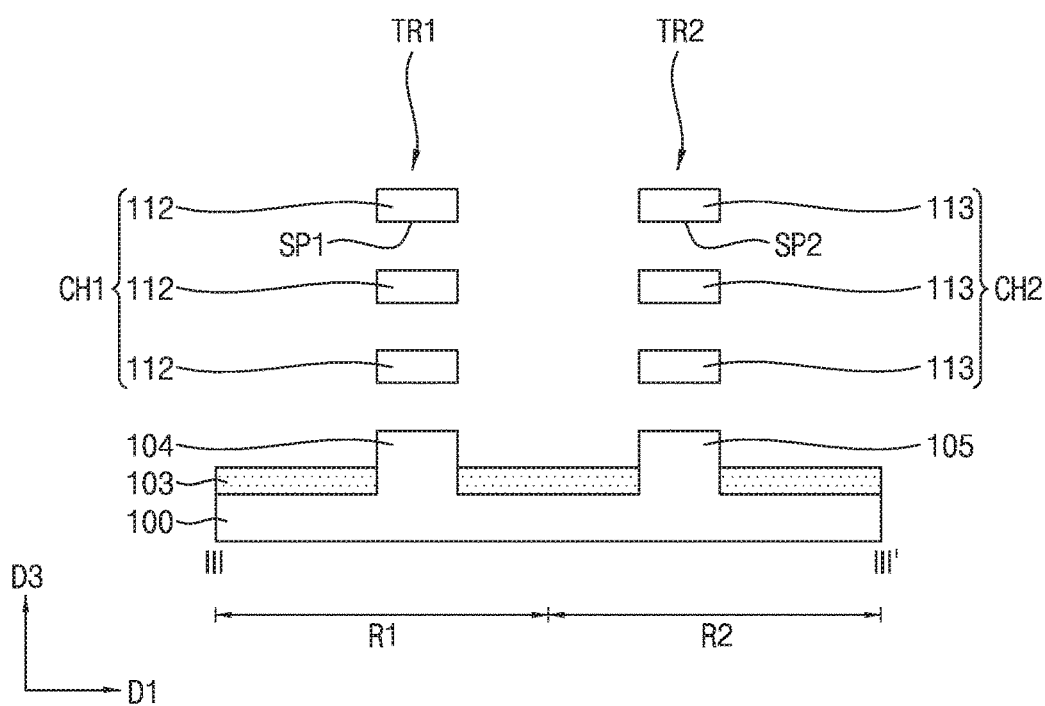

Referring to FIGS. 11 to 13, the method may include forming an interlayer insulating layer 150 on the entire surface of the substrate 100. The interlayer insulating layer 150 may be planarized until the upper surface of the sacrificial gate pattern 132 is exposed. The planarization process of the interlayer insulating layer 150 may include a chemical mechanical polishing (CMP) and/or an etch back process. As the interlayer insulating layer 150 is planarized, the gate mask pattern 134 may be removed to expose the sacrificial gate pattern 132. For example, the interlayer insulating layer 150 may include silicon oxide or silicon oxynitride.

The sacrificial gate pattern 132 exposed by the planarization process may be selectively removed. The sacrificial gate pattern 132 may be removed, and trenches TR1 and TR2 may be formed above the first and second channel patterns CH1 and CH2 to expose the first and second channel patterns CH1 and CH2. The trenches TR1 and TR2 may expose the sacrificial patterns SCP. The first trench TR1 exposing the first semiconductor patterns 112 is formed in the first active region R1, and the second trench TR2 exposing second semiconductor patterns 113 is formed in the second active region R2. The first trench TR1 and the second trench TR2 may be contiguous with each other to form one space such that the upper surfaces of the first and second channel patterns CH1 and CH2 are exposed and such that side surfaces of the first and second channel patterns CH1 and CH2 in the first direction D1 are also exposed, as shown in FIG. 11. The sacrificial patterns SCP exposed in the trenches TR1 and TR2 may be selectively removed. For example, when the sacrificial patterns SCP include SiGe and the first and second semiconductor patterns 112 and 113 include Si, the selective etching process may be performed using an etchant containing peracetic acid. The etchant may further include hydrofluoric acid (HF) aqueous solution and deionized water. The first and second source/drain regions SD1 and SD2 may be covered and protected by the inner spacers GP2 and the interlayer insulating layer 150.

The sacrificial patterns SCP are removed to form first spaces SP1 between the first semiconductor patterns 112 that are vertically spaced apart from each other, and second spaces SP2 between the second semiconductor patterns 113 that are vertically spaced apart from each other. The first spaces SP1, the second spaces SP2, and the trenches TR1 and TR2 may be contiguous with each other to expose upper, lower, and side surfaces of the first and second semiconductor patterns 112 and 113.

Figure 14:
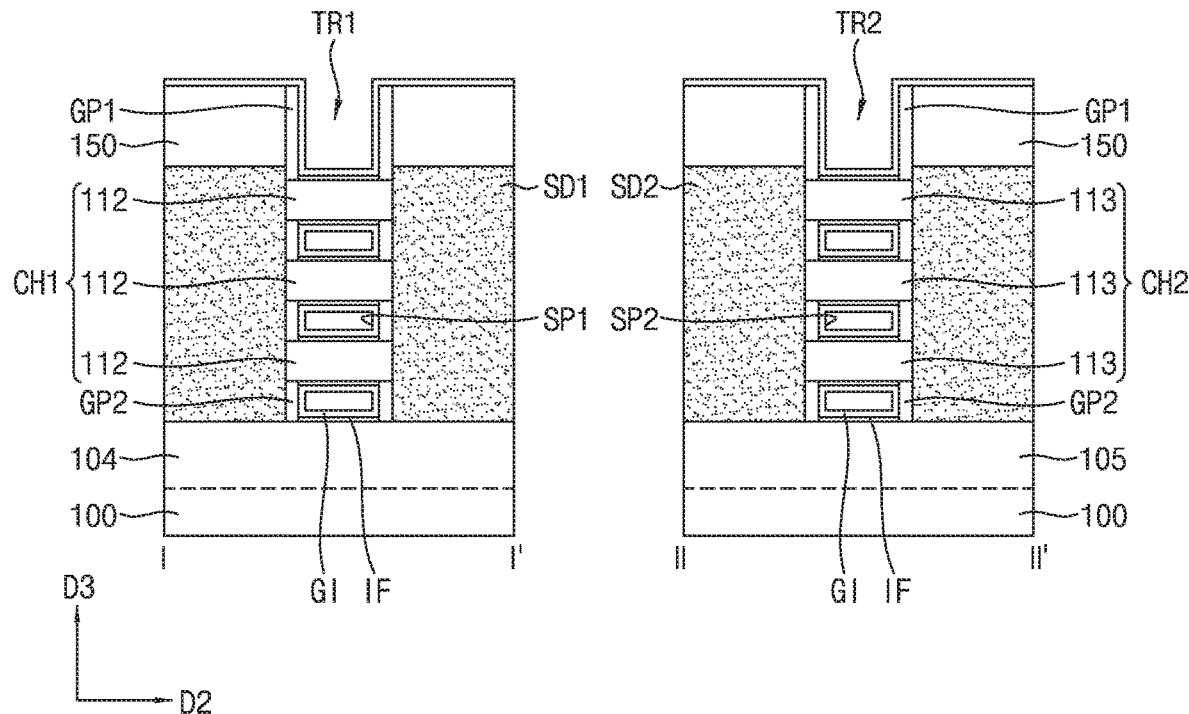
Figure 15:
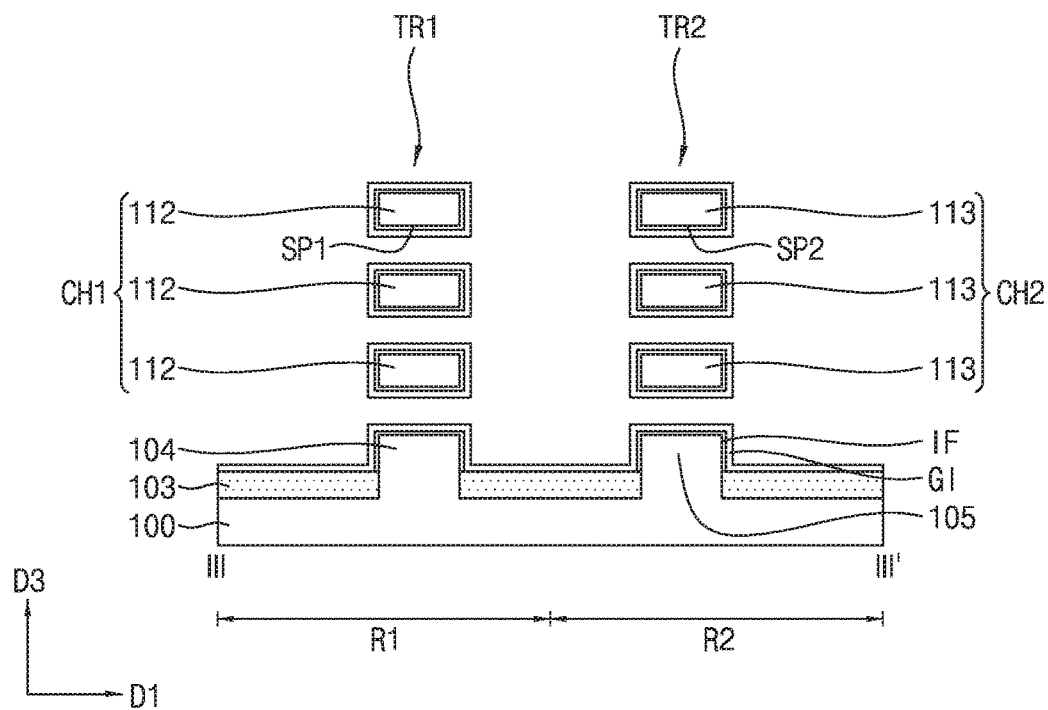

Referring to FIGS. 14 and 15, the method may include growing an interfacial layer IF on first and second semiconductor patterns 112 and 113 exposed through the trenches TR1 and TR2, the first spaces SP1, and the second spaces SP2. FIG. 14 is a view taken along lines I-I' and II-II' that are similar to the lines I-I' and II-II' of FIG. 11 and FIG. 15 is a view taken along line III-III' that is similar to the line III-III' of FIG. 11. The interface layer IF may be formed by performing an oxidation process using plasma on the first and second semiconductor patterns 112 and 113. The interfacial layer IF may directly surround all of the exposed surfaces of the exposed first and second semiconductor patterns 112 and 113. Forming the interfacial layer IF may include a thermal oxidation and/or chemical oxidation process. The oxidation process may use a plasma of at least one of oxygen, ozone and water vapor. For example, the interface layer IF may include a silicon oxide.

A gate dielectric layer GI may be conformally formed on the interface layer IF. The gate dielectric layer GI may partially fill the trenches TR1 and TR2, the first spaces SP1, and the second spaces SP2. The gate dielectric layer GI may directly cover the inner spacers GP2, outer spacers GP1 and the interface layer IF. The gate dielectric layer GI may cover the isolation layer 103 as shown in FIG. 15. The gate dielectric layer GI may be formed using a high dielectric constant material having a higher dielectric constant than that of the silicon oxide.

Figure 16:
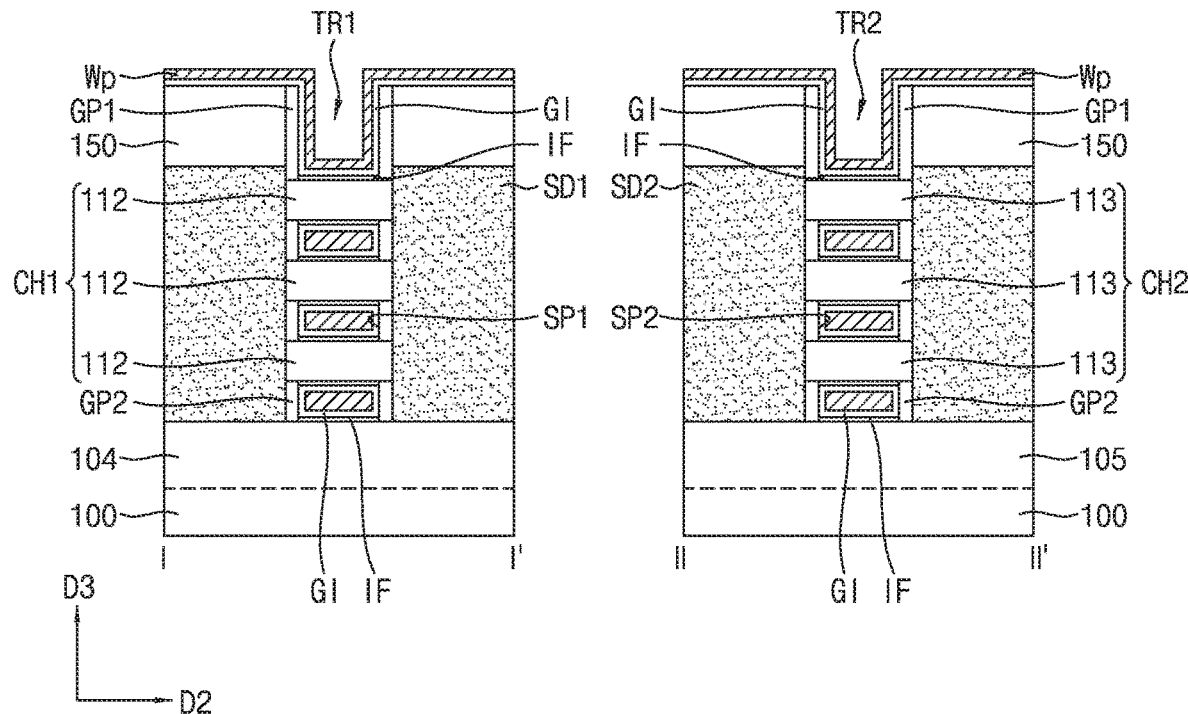
Figure 17:
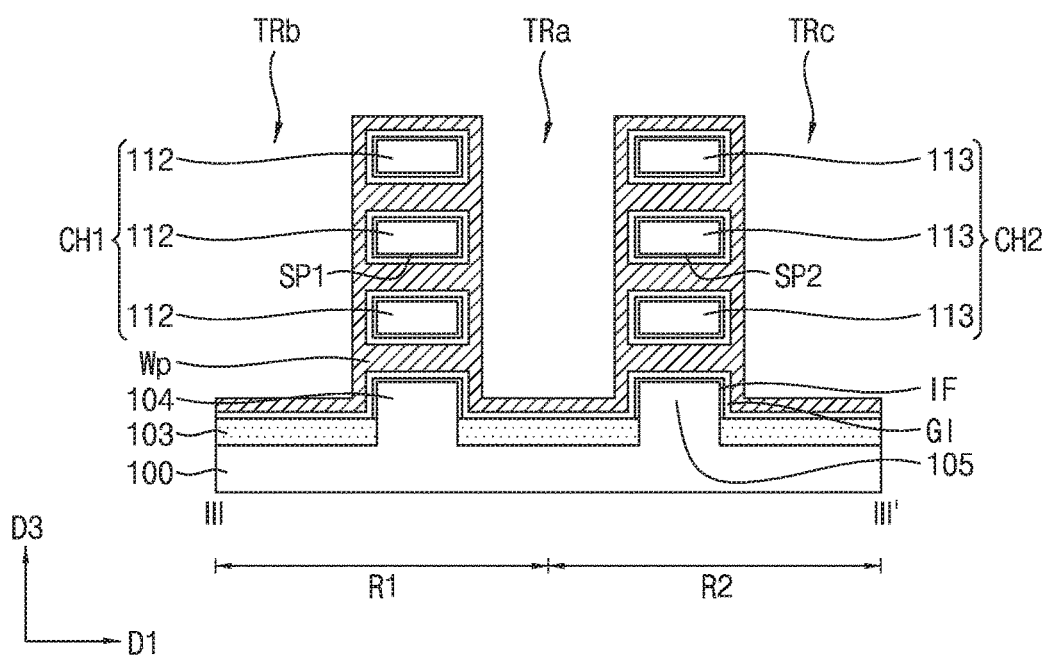

Referring to FIGS. 16 and 17, the method may include conformally forming a conductive layer Wp in the trenches TR1 and TR2. The conductive layer Wp may completely fill the first spaces SP1 and the second spaces SP2. The conductive layer Wp may completely surround the first semiconductor patterns 112, the second semiconductor patterns 113, the interface layer IF, and the gate dielectric layer GI. In addition, the conductive layer Wp may completely cover the gate dielectric layer GI covering the device isolation layer 103, the first upper pattern 104, and the second upper pattern 105. The conductive layer Wp may be formed through a deposition process such as ALD. For example, the conductive layer Wp may include TiN.

The conductive layer Wp may completely fill the first spaces SP1 and the second spaces SP2. Residual spaces may be left in the trenches TR1 and TR2 above the uppermost first and second semiconductor patterns 112 and 113. Residual spaces may also be left on both sides of the conductive layer Wp in the first direction D1. For example, a trench TRa may be formed between the portion of the conductive layer Wp surrounding the first semiconductor patterns 112 and the portion of the conductive layer Wp surrounding the second semiconductor patterns 113. The trench TRb may be formed on one side of the first semiconductor patterns 112, and the trench TRc may be formed on the other side of the second semiconductor patterns 113.

Figure 18:
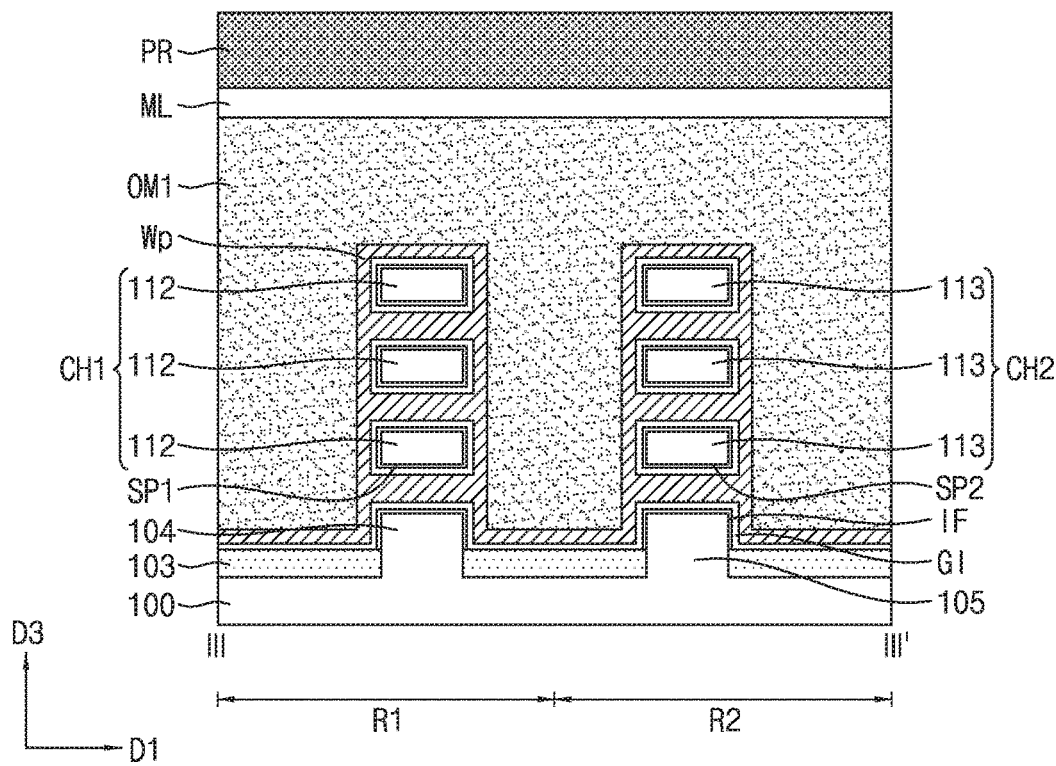

Referring to FIG. 18, the method may include forming a first organic layer OM1 covering the conductive layer Wp on the first semiconductor patterns 112 and the second semiconductor patterns 113. The first organic layer OM1 may completely fill the trenches TR1 and TR2. In an example embodiment, the first organic layer OM1 may include a base resin, a cross-linking agent, and a thermal acid generator (TAG). The first organic layer OM1 includes a coating solution obtained by dissolving organic base resins (R'—OH) in a solvent together with a cross-linking agent, and may be formed by performing a method such as spin coating, spray coating and deep coating on the conductive layer Wp. The first organic layer OM1 may be coated on the conductive layer Wp without cross-linking.

For example, the base resin included in the first organic material layer OM1 may be a material such as PMMA (poly(methyl 2-methylpropenoate)), PHS poly(12-hydroxystearic acid), polyester, polyimide, polycarbonate, polycarbamate, polyamide, polyphenol, and/or dextrin ester, but is not limited thereto.

For example, the cross-linking agent included in the first organic layer OM1 may include glycouril, melamine, urea and/or benzoguanamine-based materials.

For example, the thermal acid generator TAG included in the first organic layer OM1 may include alkyl esters of organic sulfonic acid, alkyl ammonium salts of organic acid, nitrobenzyl tosylate, nitrobenzyl ester, benzoin tosylate, benzene sulfonate, and phenolic sulfonate esters, iodonium and/or sulfonium compound (fluorosulfonate).

In an example embodiment, the thermal acid generator (TAG) may be composed of aliphatic or alicyclic compounds. For example, the thermal acid generator (TAG) may be composed of at least one compound selected from the group consisting of carbonate esters, sulfonate esters, and phosphate esters. As a specific example, the thermal acid generator (TAG) may be composed of at least one compound selected from the group consisting of cyclohexyl nonafluorobutanesulfonate, norbornyl nonafluorobutanesulfonate, tricyclodecanyl nonafluorobutanesulfonate, adamantyl nonafluorobutanesulfonate, cyclohexyl nonafluorobutanecarbonate, norbornyl nonafluorobutanecarbonate, tricyclodecanyl nonafluorobutanecarbonate, adamantyl nonafluorobutanecarbonate, cyclohexyl nonafluorobutanephosphonate, norbornyl nonafluorobutanephosphate nonafluorobutanephosphonate, tricyclodecanyl nonafluorobutanephosphonate, and adamantyl nonafluorobutanephosphonate but not limited thereto.

The method may include cross-linking reaction of the first organic material layer OM1 by heat treatment at 180 to 300° C. The cross-linked first organic material layer OM1 may be in a state in which it is not dissolved in a solvent.

The mask layer ML and the photoresist layer PR may be sequentially stacked on the first organic layer OM1. The mask layer ML may include a material having an etch selectivity with respect to the heat treated first organic material layer OM1. For example, the mask layer ML may include an oxide (inorganic material).

Figure 19:
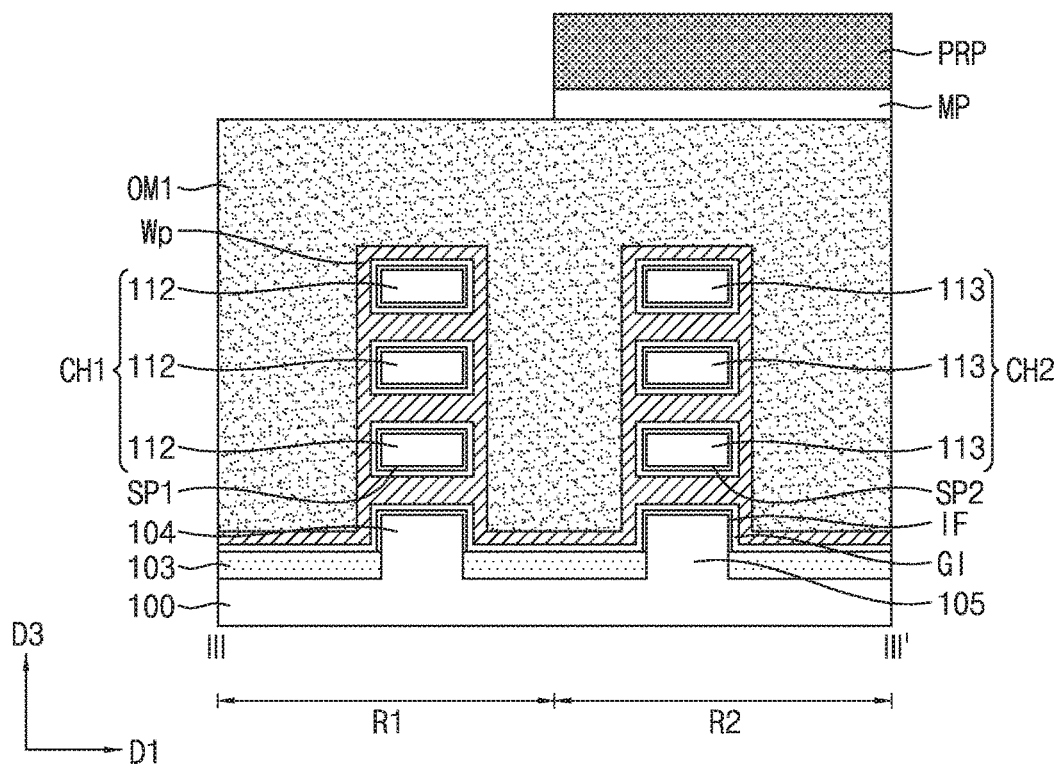

Referring to FIG. 19, the method may include exposing the photoresist layer PR to form a photoresist pattern PRP above the second channel pattern CH2. For example, the light source of exposure can be a KrF excimer laser (248 nm), an ArF excimer laser (193 nm), an F2 excimer laser (157 nm), or a light source capable of emitting extreme ultraviolet (EUV) (13.5 nm). However, the disclosure is not limited thereto.

The method may include forming a mask pattern MP above the second semiconductor patterns 113 by patterning the mask layer ML through an etching process using the photoresist pattern PRP as an etching mask. An upper surface of the first organic layer OM1 may be exposed above the first semiconductor patterns 112 of the first channel pattern CH1.

Figure 20:
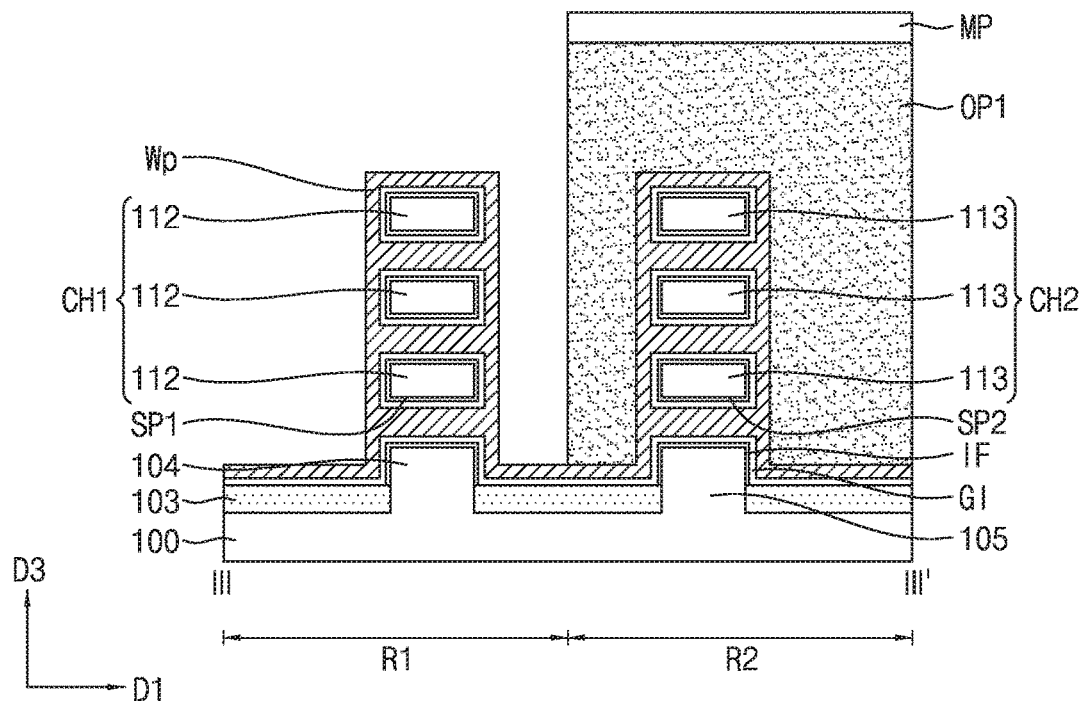

Referring to FIG. 20, the method may include exposing an upper surface of the mask pattern MP by removing the photoresist pattern PRP by performing an ashing or strip process. A portion of the first organic layer OM1 may be removed through an etching process using the mask pattern MP as an etching mask and a first organic pattern OP1 may be formed on the second semiconductor patterns 113. The first organic pattern OP1 may cover the interface layer IF and the gate dielectric layer GI surrounding the second semiconductor patterns 113. For example, the first organic pattern OP1 may be etched by a dry etching. As the first organic layer OM1 is partially removed and the first organic pattern OP1 is formed, the conductive layer Wp surrounding the first channel pattern CH1 may be exposed.

Figure 21:
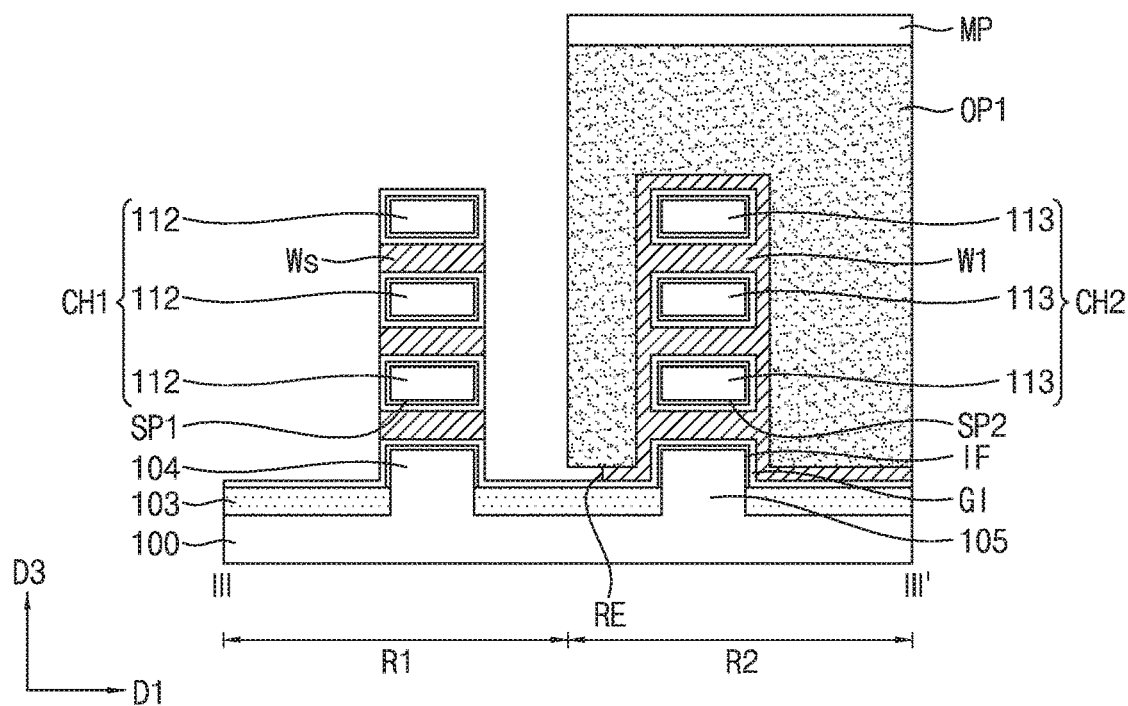

Referring to FIG. 21, the method may include forming sacrificial patterns Ws and conductive pattern W1 by partially removing the conductive layer Wp. For example, the conductive layer Wp may be partially etched by a wet etching process using the mask pattern MP as an etching mask. A portion of the conductive layer Wp that surrounds the first channel pattern CH1 and the gate dielectric layer GI and is exposed (i.e., not covered by the first organic pattern OP1) is etched so that the sacrificial patterns Ws and the conductive pattern W1 may be formed. Portions disposed in spaces other than the first spaces of the exposed conductive layer may be removed, and the exposed conductive layer may remain only in the first spaces. As a result, sacrificial patterns Ws may be formed. The sacrificial patterns Ws are formed between the first semiconductor patterns 112 of the first channel pattern CH1 and may contact the gate dielectric layer GI. In an example embodiment, both side surfaces of the sacrificial patterns Ws in the first direction D1 may be exposed and may have a shape recessed inwardly. However, the disclosure is not limited thereto, and both sides of the sacrificial patterns Ws may be substantially coplanar with each of both outer surfaces of the gate dielectric layer GI in the first direction D1.

As the conductive layer Wp is partially removed, the conductive pattern W1 surrounding the second channel pattern CH2 and the gate dielectric layer GI may remain inside and/or under the first organic pattern OP1. The conductive pattern W1 may be separated from the sacrificial patterns Ws while the conductive layers Wp in the trench TRa between the first channel pattern CH1 and the second channel pattern CH2 are partially removed. The conductive layer Wp between the first channel pattern CH1 and the second channel pattern CH2 may be removed up to a portion of the conductive layer Wp that is in contact with the lower surface of the first organic pattern OP1. The conductive pattern W1 corresponds to the first work function metal layer W1 described with reference to FIGS. 2 and 3.

While the conductive layer Wp in contact with the lower surface of the first organic pattern OP1 is partially removed, a recess region RE may be formed under the first organic pattern OP1 as shown in FIG. 21. The recess region RE may be defined by the lower surface of the first organic pattern OP1, one end of the conductive pattern W1, and an upper surface of the gate dielectric layer GI. In an example embodiment, a width in the first direction D1 of the recess region RE is substantially the same as a thickness of the conductive layer Wp disposed on the gate dielectric layer GI in contact with the isolation layer 103. That is, the width in the first direction D1 of the recess region RE may be substantially the same as the thickness of the conductive layer Wp removed by the wet etching to form the sacrificial patterns Ws and the conductive pattern W1. For example, the width of the recess region RE in the first direction D1 may be about 3 nm to about 5 nm.

Figure 22:
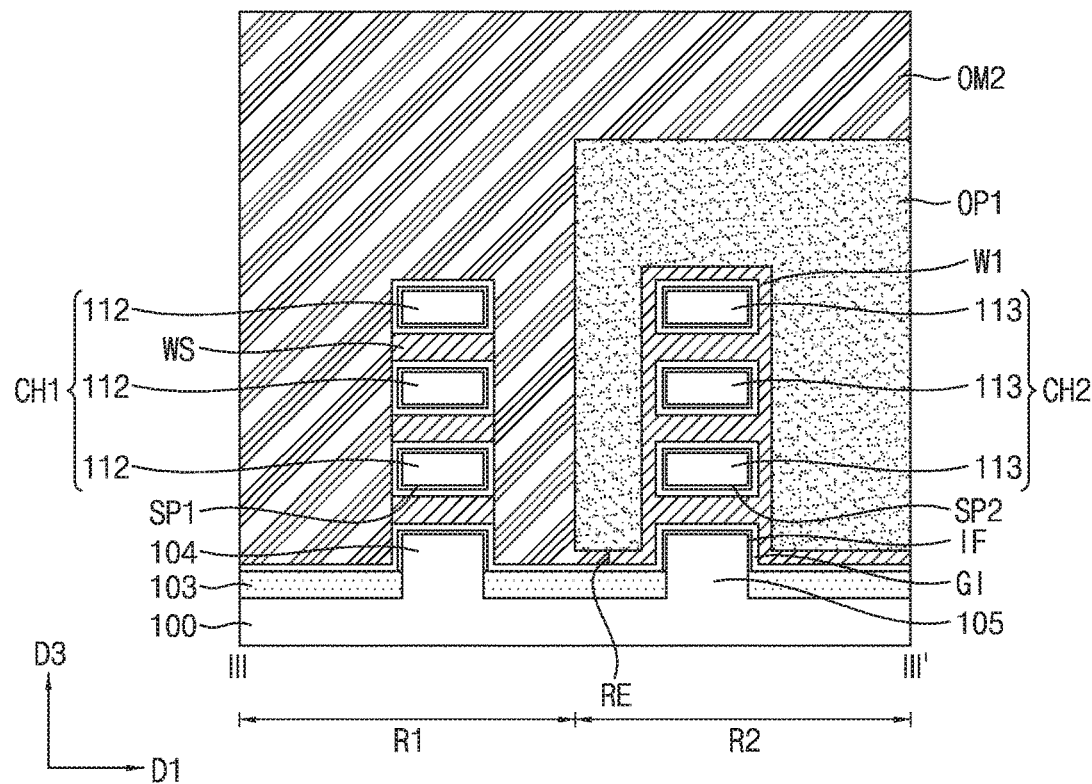

Referring to FIG. 22, the method may include forming a second organic layer OM2 covering the first organic pattern OP1, the gate dielectric layer GI surrounding the first channel pattern CH1, and the sacrificial patterns Ws. The second organic layer OM2 may cover and directly contact the gate dielectric layer GI covering the isolation layer 103 and the first upper pattern 104. The second organic layer OM2 may fill the recess region RE formed under the first organic pattern OP1. The second organic layer OM2 may contact the lower surface of the first organic pattern OP1 and one end of the conductive pattern W1 exposed by the recess region RE.

In an example embodiment, the second organic layer OM2 may include a base resin and a cross-linking agent. Unlike the first organic layer OM1, the second organic layer OM2 may not include a thermal acid generator TAG. The second organic layer OM2 may include the same base resin and the same cross-linking agent as the first organic layer OM1. Alternatively, the second organic layer OM2 may include a base resin and/or a cross-linking agent different from the first organic layer OM1.

Figure 23:
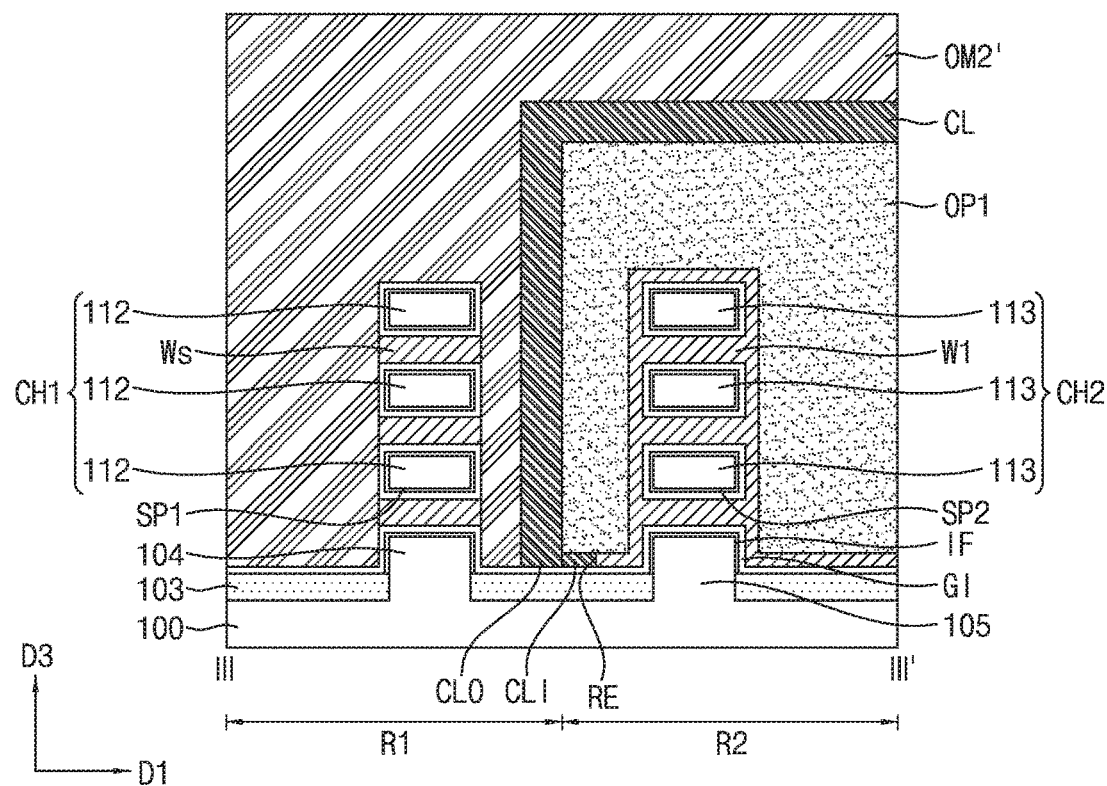

Referring to FIG. 23, the method may include forming a cross-linking layer CL and a second organic pattern OM2' by cross-linking the base resin and the cross-linking agent of the second organic layer OM2. After the first organic pattern OP1 and the second organic layer OM2 are formed, an acid may be generated in the thermal acid generator TAG included in the first organic pattern OP1 when a heat treatment process is performed at 150 to 240° C. The generated acid may diffuse into the second organic layer OM2. The cross-linking layer CL may be formed by cross-linking the cross-linking agent and the base resin of the second organic layer OM2 by the acid diffused from the thermal acid generator TAG. That is, a portion of the second organic layer OM2 may be converted into the cross-linking layer CL by the thermal acid generator TAG. For example, the heat treatment process may be a soft baking or a PEB (post exposure baking) process.

The cross-linking layer CL may be formed in contact with the first organic pattern OP1. The cross-linking layer CL may contact the lower surface of the first organic pattern OP1 exposed by the recess region, and may contact with the upper surface and the side surface of the first organic pattern OP1. The cross-linking layer CL may fill the recess region RE and may contact the one end of the conductive pattern W1. A portion of the second organic layer OM2 adjacent to the first organic pattern OP1 is transformed into the cross-linking layer CL, and a non-crosslinked portion of the second organic layer OM2 which is not crosslinked may be referred to as the second organic pattern OM2'. That is, the cross-linking layer CL may be interposed between the first organic pattern OP1 and the second organic pattern OM2'. The second organic pattern OM2' may cover the first semiconductor patterns 112, the gate dielectric layer GI surrounding the first semiconductor patterns 112, the sacrificial patterns Ws, and the first organic pattern OP1. The second organic pattern OM2' may directly cover the cross-linking layer CL that is provided between the second organic pattern OM2' and the first organic pattern OP1 as shown in FIG. 23. In an example embodiment, the cross-linking layer CL may include an inner portion CLI disposed in the recess region RE and an outer portion CLO disposed outside the recess region RE. The inner portion CLI of the cross-linking layer CL may contact the conductive pattern W1. A thickness of the inner portion CLI may be thinner than the outer portion CLO. For example, the inner portion CLI may have a thickness of about 1 nm to 5 nm. The outer portion CLO may have a thickness of about 5 nm to 50 nm. That is, the inner surface of the second organic pattern OM2' may be formed 5 to 50 nm away from the outer surface of the first organic pattern OP1 in the first direction D1.

Figure 24:
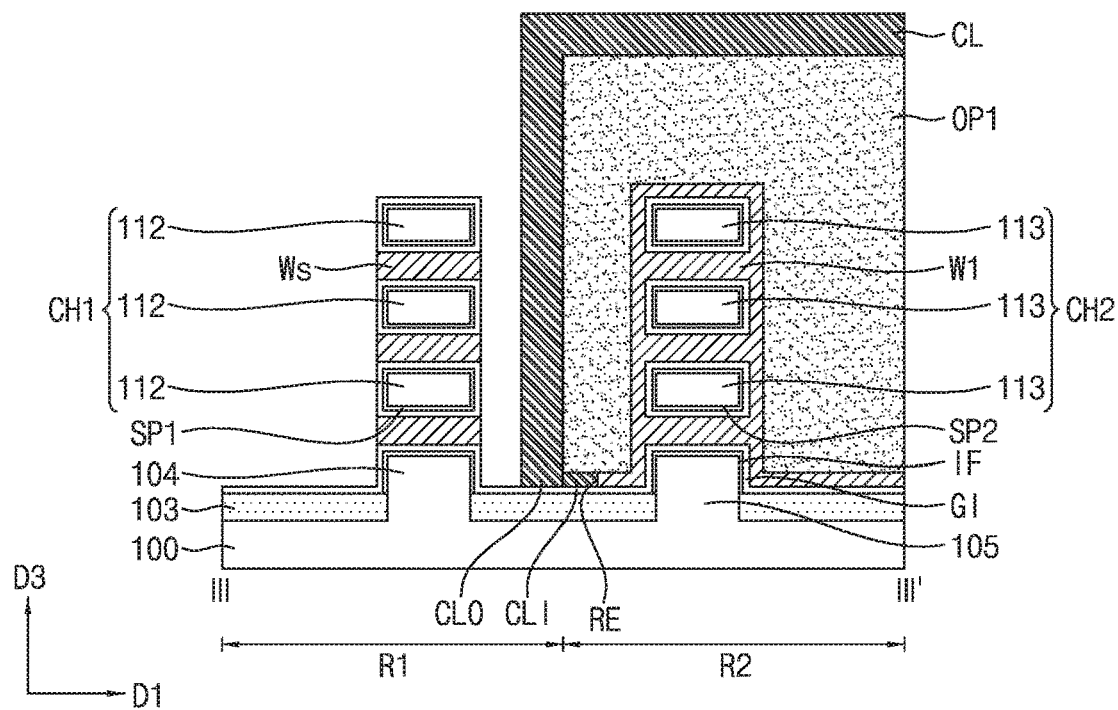

Referring to FIG. 24, the method may include removing the second organic pattern OM2' outside the cross-linking layer CL. For example, the method may provide an organic solvent or an alkaline aqueous solution on the second organic pattern OM2' which is the non-crosslinked portion, and selectively remove the second organic pattern OM2' by rinsing. Since the cross-linking layer CL is maintained in a crosslinked state, it may remain without being removed by the organic solvent or the alkaline aqueous solution. The second organic pattern OM2' which is the non-crosslinked portion is removed to expose the gate dielectric layer GI surrounding the first channel pattern CH1 and the sacrificial patterns Ws between the first channel patterns CH1.

Figure 25:
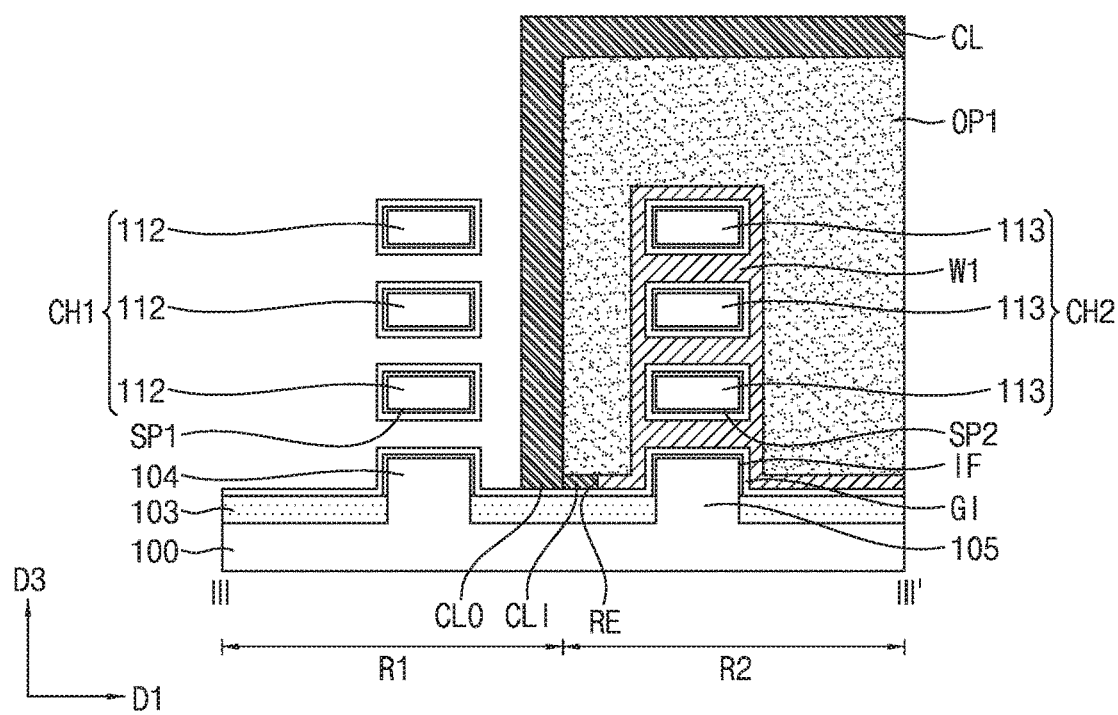

Referring to FIG. 25, the method may include removing sacrificial patterns Ws through an etching process using the cross-linking layer CL and the gate dielectric layer GI as an etching mask. For example, the sacrificial patterns Ws may be removed by a wet etching process. The sacrificial patterns Ws may be removed by a wet etching process using an etchant having an etching selectivity with respect to the cross-linking layer CL and the gate dielectric layer GI. The sacrificial patterns Ws may be removed and the first spaces SP1 may then be empty.

Figure 26:
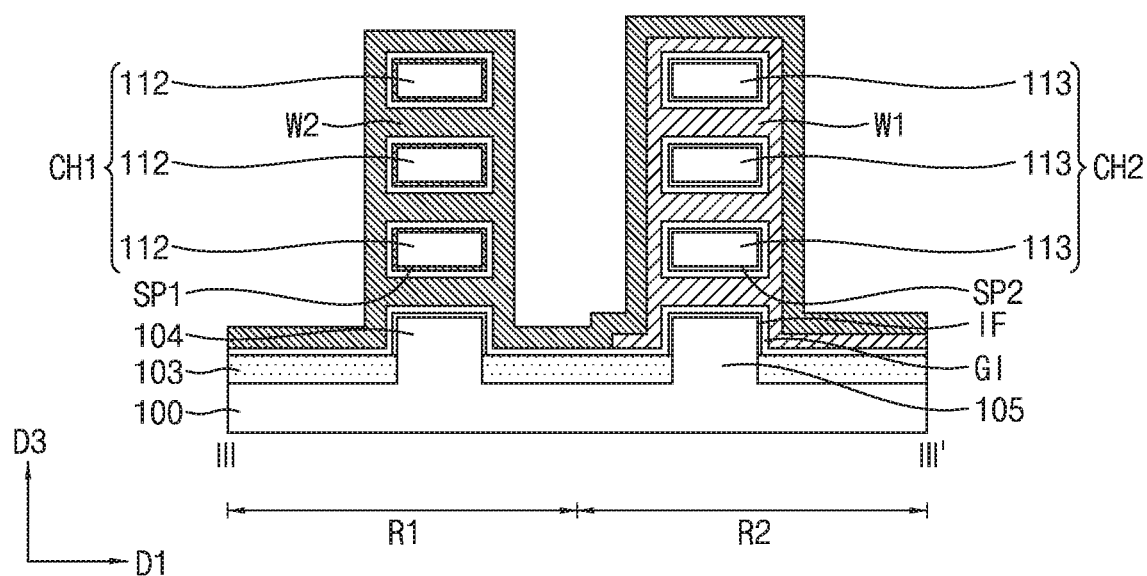

Referring to FIG. 26, the method may include removing the cross-linking layer CL and the first organic pattern OP1. The cross-linking layer CL and the first organic pattern OP1 may be removed and the conductive pattern W1 may therefore be exposed. Thereafter, a second work function metal layer W2 may be formed on the substrate 100 to cover the first channel pattern CH1 and the conductive pattern W1. The second work function metal layer W2 may be formed in direct contact with the gate dielectric layer GI surrounding the first channel pattern CH1 and with the conductive pattern W1. The second work function metal layer W2 may fill the first spaces SP1 between the first channel patterns CH1. The second work function metal layer W2 may have a step formed at one end of the first work function metal layer W1 positioned between the first upper pattern 104 and the second upper pattern 105 as shown in FIG. 26.

Subsequently, as illustrated in FIGS. 2 and 3, a plurality of work function adjustment metal layers WF and a gate electrode layer EL may be formed on the second work function metal layer W2.

In an example embodiment, at least one work function metal layer is formed on the second work function metal layer W2. As the same or similar process as that of FIGS. 18 to 25 is performed, in addition to the first work function metal layer W1, the work function metal layer or the work function adjustment layer may be formed on only one of the first active region R1 or the second active region R2. For example, the work function adjustment layer may generate a dipole, and may include a material capable of raising the threshold voltage of the transistor due to an energy band change caused by the dipole. The work function adjustment layer may include a high dielectric constant material having a higher dielectric constant than that of the silicon oxide layer. For example, the work function adjustment layer may include a metal oxide such as lanthanum oxide or aluminum oxide.

According to an example embodiment of the disclosure, a method of manufacturing gate all around type (or multi-bridge channel type) semiconductor devices having multiple threshold voltages by using different kinds of organic materials, and disposed adjacent to each other can be provided. In the process of manufacturing the gate all around semiconductor devices disposed adjacent to each other, the devices defects can be reduced by preventing the gate electrode from over etching by a wet etching process.

While example embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor device manufacturing method comprising:
    forming first semiconductor patterns extending in a first direction on a substrate, the first semiconductor patterns being spaced vertically from each other;
    forming second semiconductor patterns positioned adjacent to the first semiconductor patterns in a second direction perpendicular to the first direction on the substrate and extending in the first direction parallel to the first semiconductor patterns;
    forming a gate dielectric layer surrounding the first semiconductor patterns and the second semiconductor patterns;
    forming a first organic pattern covering the second semiconductor patterns;
    forming a sacrificial pattern interposed between the first semiconductor patterns and both side surfaces of the sacrificial pattern are exposed;
    forming a conductive pattern surrounding the second semiconductor patterns and disposed between the first organic pattern and the second semiconductor patterns;
    forming a second organic pattern covering the first semiconductor patterns, the gate dielectric layer, the sacrificial pattern, and the first organic pattern;
    forming a cross-linking layer interposed between the first organic pattern and the second organic pattern;
    removing the second organic pattern on the cross-linking layer and exposing the sacrificial pattern; and
    removing the sacrificial pattern.

2. The semiconductor device manufacturing method as claimed in claim 1, wherein the cross-linking layer has a thickness of 5 nm to 50 nm.

3. The semiconductor device manufacturing method as claimed in claim 1, wherein the forming the first organic pattern comprises:
    forming a first organic layer on the first semiconductor patterns and the second semiconductor patterns and performing a heat treatment at 180° C. to 300° C.;
    stacking sequentially a mask layer and a photoresist layer on the first organic layer;
    exposing the photoresist layer, forming a mask pattern disposed on the first semiconductor patterns by etching the mask layer, and exposing a portion of an upper surface of the first organic layer on the second semiconductor patterns; and
    forming the first organic pattern by removing a portion of the first organic layer using the mask pattern as an etching mask.

4. The semiconductor device manufacturing method as claimed in claim 3, wherein the first organic layer includes a base resin, a cross-linking agent and a thermal acid generator.

5. The semiconductor device manufacturing method as claimed in claim 3, wherein the forming the sacrificial pattern and the conductive pattern further comprises:
    forming a conductive layer extending in the second direction to cover the first semiconductor patterns and the second semiconductor patterns, before the forming the first organic pattern; and
    removing a portion of the conductive layer by a wet etching process using the mask pattern as an etching mask.

6. The semiconductor device manufacturing method as claimed in claim 5, wherein the forming the sacrificial pattern and the conductive pattern further comprises forming a recess region in the first organic pattern by removing the portion of the conductive layer by the wet etching process, the recess region extending toward the second semiconductor patterns.

7. The semiconductor device manufacturing method as claimed in claim 6, wherein the cross-linking layer fills the recess region and is in contact with the conductive pattern.

8. The semiconductor device manufacturing method as claimed in claim 5, wherein the forming the second organic pattern and the cross-linking layer comprises:
    forming a second organic layer covering the first organic pattern,
    generating acid from a thermal acid generator included in the first organic pattern, and
    diffusing the acid to the second organic layer by performing a heat treatment at 150° C. to 240° C.

9. The semiconductor device manufacturing method as claimed in claim 8, wherein the second organic layer includes a base resin and a cross-linking agent.

10. The semiconductor device manufacturing method as claimed in claim 1, wherein the first semiconductor patterns is disposed in an N-type metal-oxide-semiconductor (NMOS) region of the substrate, and the second semiconductor patterns is disposed in a P-type metal-oxide-semiconductor (PMOS) region of the substrate adjacent to the NMOS region.

11. The semiconductor device manufacturing method as claimed in claim 1, wherein the semiconductor device includes an isolation layer,
    wherein the forming the first semiconductor patterns further comprises forming a first upper pattern protruding from the substrate and vertically overlapping the first semiconductor patterns,
    wherein the forming the second semiconductor patterns further comprises forming a second upper pattern protruding from the substrate and vertically overlapping the second semiconductor patterns, and
    wherein an upper surface of the first upper pattern and an upper surface of the second upper pattern are located higher than an upper surface of the isolation layer.

12. The semiconductor device manufacturing method as claimed in claim 1, wherein the semiconductor device manufacturing method further comprises forming source/drain regions disposed at both ends of each of the first semiconductor patterns and the second semiconductor patterns in the first direction, before forming the gate dielectric layer.

13. A semiconductor device manufacturing method comprising:
    forming first semiconductor patterns extending in a first direction on a substrate, the first semiconductor patterns vertically overlapping each other;
    forming second semiconductor patterns extending in the first direction in parallel with the first semiconductor patterns and adjacent to the first semiconductor patterns in a second direction perpendicular to the first direction, and vertically overlapping each other;

forming a gate dielectric layer surrounding the first semiconductor patterns and the second semiconductor patterns;

forming a conductive layer surrounding the gate dielectric layer;

forming a first organic pattern covering a portion of the conductive layer;

forming a conductive pattern and a sacrificial pattern by removing a second portion of the conductive layer, the sacrificial pattern being interposed between the first semiconductor patterns, the conductive pattern surrounding the second semiconductor patterns, and forming a recess region defined by the first organic pattern and the conductive pattern;

forming an organic layer covering the first semiconductor patterns, the gate dielectric layer, and the first organic pattern, the organic layer filling the recess region;

converting a portion of the organic layer into a cross-linking layer in contact with the first organic pattern, and forming a non-crosslinking portion on the cross-linking layer;

removing the non-crosslinking portion and exposing the sacrificial pattern; and removing the sacrificial pattern, wherein the converting the portion of the organic layer into the cross-linking layer comprises diffusing an acid of the first organic pattern into the organic layer.

14. The semiconductor device manufacturing method as claimed in claim 13, wherein the cross-linking layer comprises an inner portion disposed in the recess region and an outer portion disposed outside the recess region, wherein the inner portion is thinner than the outer portion.

15. The semiconductor device manufacturing method as claimed in claim 14, wherein the inner portion has a thickness in a range from 3 nm to 5 nm, and the outer portion has a thickness in a range from 5 nm to 50 nm.

16. The semiconductor device manufacturing method as claimed in claim 13, wherein the first organic pattern includes a first base resin, a first cross-linking agent and a thermal acid generator, and the organic layer includes a second base resin and a second cross-linking agent.

17. A semiconductor device manufacturing method comprising:

forming a first transistor including first semiconductor patterns surrounded by a work function metal layer on a substrate, and forming a second transistor including second semiconductor patterns parallel to the first semiconductor patterns on the substrate, and a conductive pattern surrounding the second semiconductor patterns under the work function metal layer, the conductive pattern extending in one direction;

wherein the forming the first transistor comprises forming sacrificial patterns disposed between the first semiconductor patterns vertically spaced apart from each other, wherein both side surfaces of each sacrificial pattern from among the sacrificial patterns are exposed, and wherein the forming the second transistor comprises forming a first organic pattern covering the conductive pattern, a cross-linking layer covering the first organic pattern, and a second organic pattern covering the cross-linking layer.

18. The semiconductor device manufacturing method as claimed in claim 17, wherein the forming the sacrificial patterns comprises:

forming a conductive layer extending in the one direction and surrounding the first semiconductor patterns and the second semiconductor patterns, forming a first organic layer covering the conductive layer and including a base resin, a cross-linking agent and a thermal acid generator, and exposing a portion of the conductive layer, and partially etching the exposed portion of the conductive layer.

19. The semiconductor device manufacturing method as claimed in claim 17, wherein the forming the conductive pattern comprises:

forming a conductive layer extending in the one direction and surrounding the first semiconductor patterns and the second semiconductor patterns, forming a first organic layer covering the conductive layer and including a base resin, a cross-linking agent and a thermal acid generator, and exposing a first portion of the conductive layer, and partially etching the exposed first portion of the conductive layer to separate a second portion of the conductive layer disposed between the first semiconductor patterns from a third portion of the conductive layer adjacent to the second semiconductor patterns, and wherein the forming the cross-linking layer comprises forming a second organic layer in which a cross-linking reaction occurs by an acid generated from the thermal acid generator.

20. The semiconductor device manufacturing method as claimed in claim 17, wherein the first transistor is an N-type metal-oxide-semiconductor field-effect transistor (NMOSFET), and the second transistor is a P-type metal-oxide-semiconductor field-effect transistor (PMOSFET).

* * * * *